(12) United States Patent
Gu

(10) Patent No.: US 10,680,552 B2
(45) Date of Patent: Jun. 9, 2020

(54) ON-CHIP OSCILLATORS INCLUDING SHARED INDUCTOR

(71) Applicant: Intel IP Corporation, Santa Clara, CA (US)

(72) Inventor: Zheng Gu, Neuss NW (DE)

(73) Assignee: Intel IP Corporation, Santa Clara, CA (US)

( * ) Notice: Subject to any disclaimer, the term of this patent is extended or adjusted under 35 U.S.C. 154(b) by 189 days.

(21) Appl. No.: 15/721,264

(22) Filed: Sep. 29, 2017

(65) Prior Publication Data

US 2019/0103834 A1    Apr. 4, 2019

(51) Int. Cl.
  *H03B 5/02*    (2006.01)
  *H03B 1/02*    (2006.01)
  *H03B 5/12*    (2006.01)

(52) U.S. Cl.
  CPC .............. *H03B 5/02* (2013.01); *H03B 1/02* (2013.01); *H03B 5/1206* (2013.01); *H03B 5/1265* (2013.01); *H03B 2200/009* (2013.01); *H03B 2200/0082* (2013.01)

(58) Field of Classification Search
  CPC ...... H03B 5/02; H03B 5/1265; H03B 5/1206; H03B 1/02; H03B 2200/0082; H03B 2200/009
  See application file for complete search history.

(56) References Cited

U.S. PATENT DOCUMENTS

| | | | |
|---|---|---|---|
| 6,798,039 B1 * | 9/2004 | Gillespie | H01F 17/0006 257/508 |
| 9,356,556 B1 * | 5/2016 | Raj | H03B 5/124 |
| 2006/0084401 A1 | 4/2006 | Castillejo et al. | |
| 2011/0051308 A1 * | 3/2011 | Chan | H01F 21/12 361/268 |
| 2011/0148535 A1 * | 6/2011 | Lee | H03B 27/00 331/117 FE |
| 2011/0234331 A1 | 9/2011 | Ding et al. | |
| 2014/0167867 A1 | 6/2014 | Ahmed et al. | |
| 2018/0205344 A1 * | 7/2018 | Brady | H03B 5/1225 |

FOREIGN PATENT DOCUMENTS

WO    WO-2019067296 A1    4/2019

OTHER PUBLICATIONS

"International Application Serial No. PCT/US2018/051923, International Search Report dated Mar. 7, 2019", 3 pgs.
"International Application Serial No. PCT/US2018/051923, Written Opinion dated Mar. 7, 2019", 8 pgs.

\* cited by examiner

*Primary Examiner* — Jeffrey M Shin
(74) *Attorney, Agent, or Firm* — Schwegman Lundberg & Woessner, P.A.

(57) ABSTRACT

Some embodiments include apparatuses and methods of using the apparatuses. One of the apparatuses includes an inductor included in an integrated circuit device, and a first oscillator and a second oscillator included in the integrated circuit device. The first oscillator includes a first terminal coupled to a conductive path of the inductor to provide a first signal. The second oscillator includes a second terminal coupled to the conductive path to provide a second signal. The first and second signals have different frequencies.

20 Claims, 22 Drawing Sheets

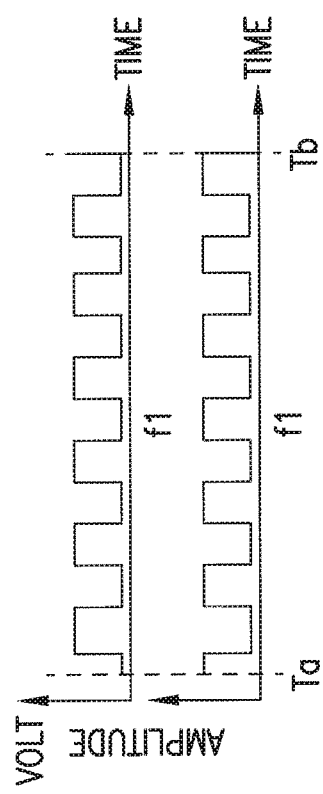
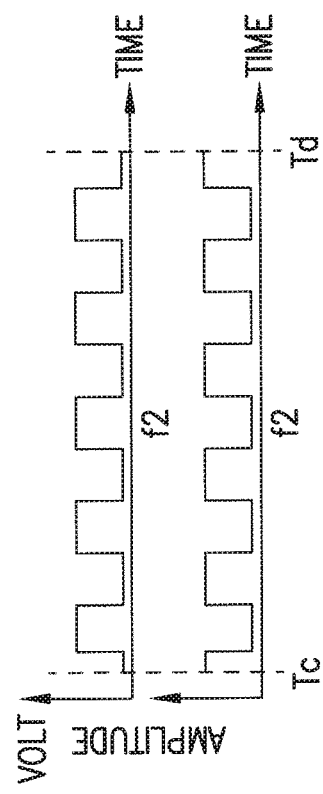

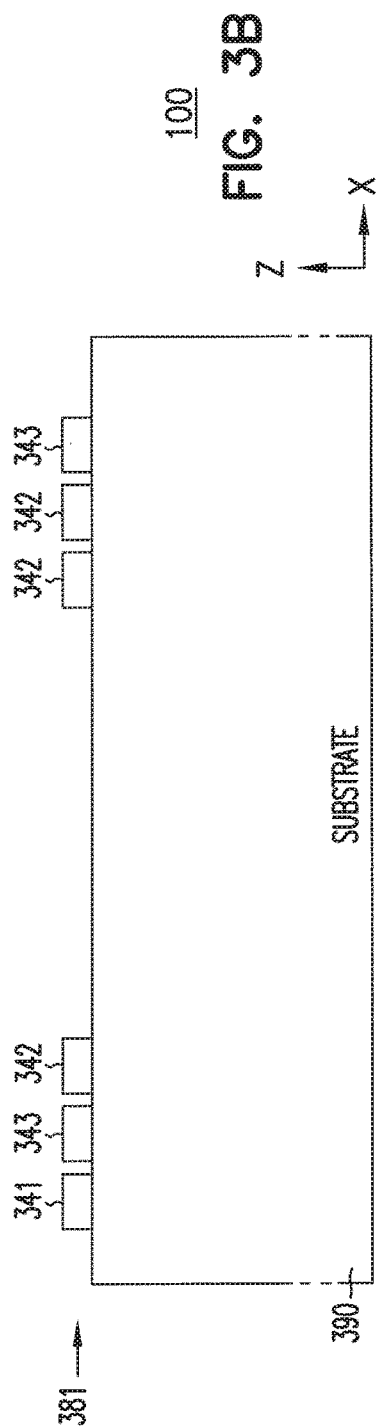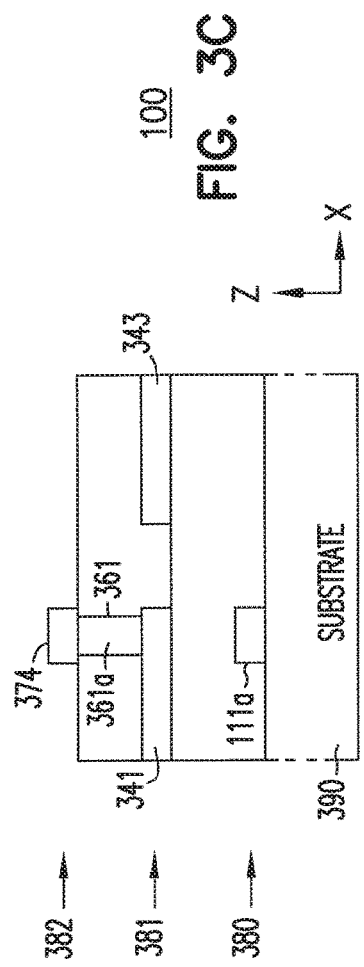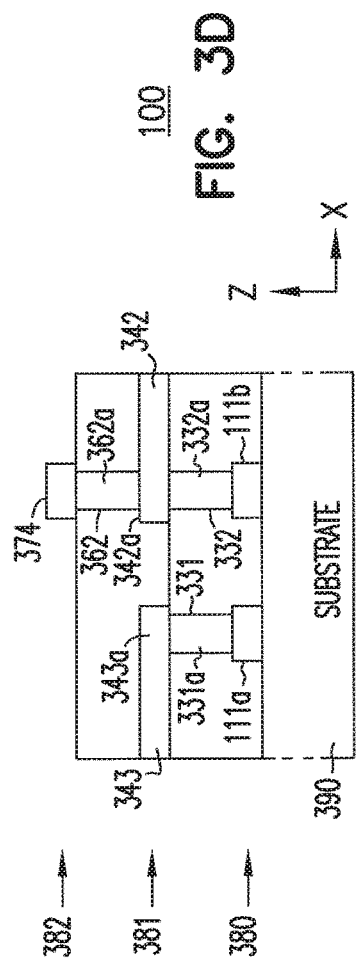

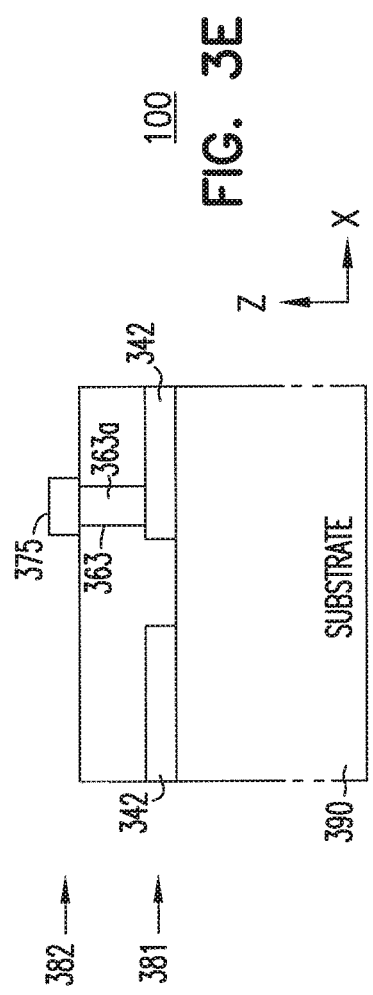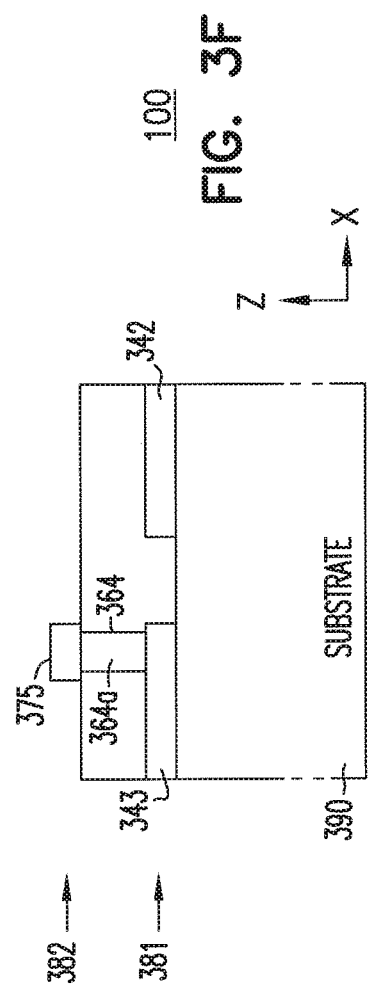

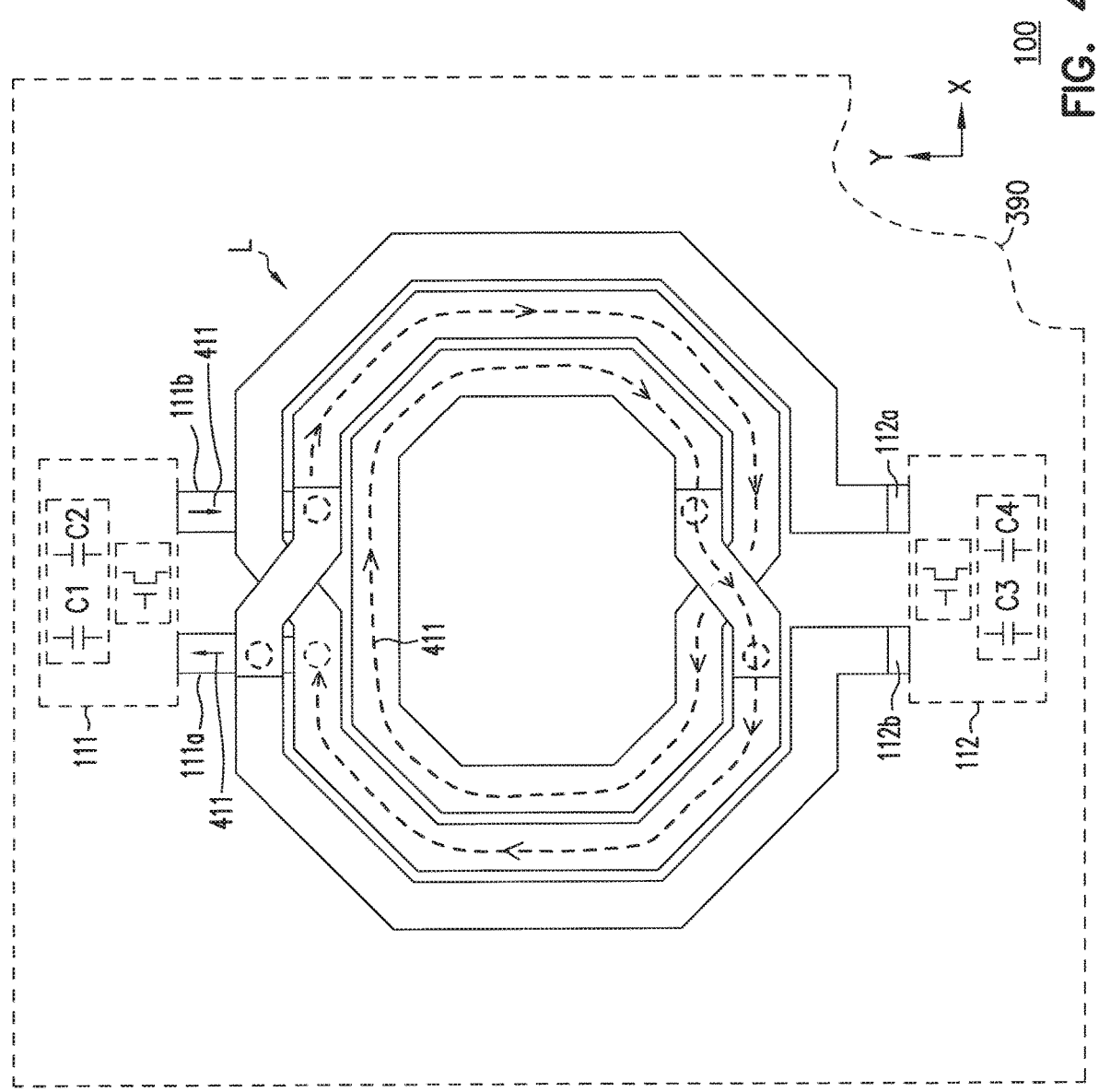

1410 — TURN ON AT LEAST ONE FIRST SWITCH DURING A FIRST TIME INTERVAL TO ELECTRICALLY COUPLE A FIRST CIRCUIT OF A FIRST OSCILLATOR TO A CONDUCTIVE PATH OF AN INDUCTOR FORMED IN AN INTEGRATED CIRCUIT DEVICE AND TO GENERATE A FIRST SIGNAL AT A FIRST TERMINAL OF THE FIRST OSCILLATOR

1420 — TURN OFF AT LEAST ONE SECOND SWITCH DURING THE FIRST TIME INTERVAL TO ELECTRICALLY DECOUPLE A SECOND CIRCUIT OF A SECOND OSCILLATOR FROM THE CONDUCTIVE PATH OF THE INDUCTOR

1430 — TURN OFF THE AT LEAST ONE FIRST SWITCH DURING A SECOND TIME INTERVAL TO ELECTRICALLY DECOUPLE THE FIRST CIRCUIT OF THE FIRST OSCILLATOR FROM THE CONDUCTIVE PATH OF THE INDUCTOR

1440 — TURN ON THE AT LEAST ONE SECOND SWITCH DURING THE SECOND TIME INTERVAL TO ELECTRICALLY COUPLE THE SECOND CIRCUIT OF THE SECOND OSCILLATOR TO THE CONDUCTIVE PATH OF THE INDUCTOR AND TO GENERATE A SECOND SIGNAL AT A SECOND TERMINAL OF THE SECOND OSCILLATOR, THE FIRST AND SECOND SIGNALS HAVING DIFFERENT FREQUENCIES

ON-CHIP OSCILLATORS INCLUDING SHARED INDUCTOR

TECHNICAL FIELD

Embodiments described herein pertain to integrated circuits. Some embodiments relate to LC (inductor-capacitor) oscillators included in integrated circuits.

BACKGROUND

Many electronic devices or systems, such as computers, tablets, and cellular phones, include an integrated circuit (IC) device (or multiple IC devices (e.g., IC chips)) to perform one or more functions. The IC device may have separate LC oscillators to generate different oscillating signals for use in different operations of the IC device. A conventional IC device that has multiple LC oscillators often employs separate inductors for separate oscillators. In some cases, separate inductors for such LC oscillators may scarify device area for power efficiency and performance of the IC device.

BRIEF DESCRIPTION OF THE DRAWINGS

FIG. 2A and FIG. 2B are timing diagrams for respective signal pairs of the oscillator circuitry of FIG. 1, according to some embodiments described herein.

FIG. 3B through FIG. 3F show side views (e.g., cross-sections) of different portions of the inductor along respective lines shown in FIG. 3A, FIG. 4A shows a circuit path (e.g., current path) in the inductor of the IC device of FIG. 3A during an example operation of the IC device where a mode is selected, according to some embodiments described herein.

FIG. 14 is a flowchart showing a method of operating an apparatus including an IC device, according to some embodiments described herein.

DETAILED DESCRIPTION

The techniques described herein include an IC device having an on-chip inductor shared by multiple oscillators of the IC device. The oscillators described herein can be used by many components of the IC device. An example of such components includes a transceiver, such as a transceiver used in wireless communication devices or systems. As is known to those skilled in the art, many transceivers for mobile (e.g., cellular) telecommunication (e.g., 3G, 4G, and 5G networks) and connectivity (e.g., global navigation satellite system (GNSS), Bluetooth, and wireless local area network (WLAN)) applications are complex systems that often operate in a very congested radio environment in a relatively wide frequency range (e.g., from 0.5 GHz to 5 GHz or more). A transceiver used in such applications usually has separate local oscillators that are designed to generate different signals having different frequencies to cover the operating frequency range of the transceiver and meet specific phase noise performance. LC oscillators are often used for such local oscillators. In many conventional techniques, each local oscillator among the separate oscillators of the transceiver has its own LC circuit (e.g., LC tank or resonance circuit (resonance tank)), and each LC circuit is designed (e.g., optimized) for a unique assigned band (e.g., frequency). Many conventional techniques use separate passive inductors of the LC local oscillators to extend the frequency tuning range. However, separate passive inductors of the LC local oscillators can complicate design efforts and may occupy a relatively large device (e.g., chip)

area for the local LC oscillators. Some other conventional techniques use serial switches in the inductor to avoid using separate passive inductors. However, serial switches introduce additional losses and parasitics.

As discussed in more detail below, the described techniques include a shared spiral inductor that can be tapped at different taps (e.g., different locations) in the inductor to build multiple LC circuits (e.g., LC tanks or resonance circuits (resonance tanks)). During operations, a portion of the taps is used in one of the LC circuits to generate an oscillating signal (or signals) having a specific frequency. An unused portion of the taps can be electrically isolated from the used taps, such that the unused portion of the taps has insignificant impact on the operation of the LC circuit associated with the used portion of the taps. Further, unlike some conventional techniques, the described techniques do not cause extra energy loss in the inductor of the oscillators because serial switches are not used in the described techniques. Thus, improved (e.g., better) power consumption and phase noise performance can be achieved. Moreover, shared inductors can save device area of the described IC device.

Figure 1:
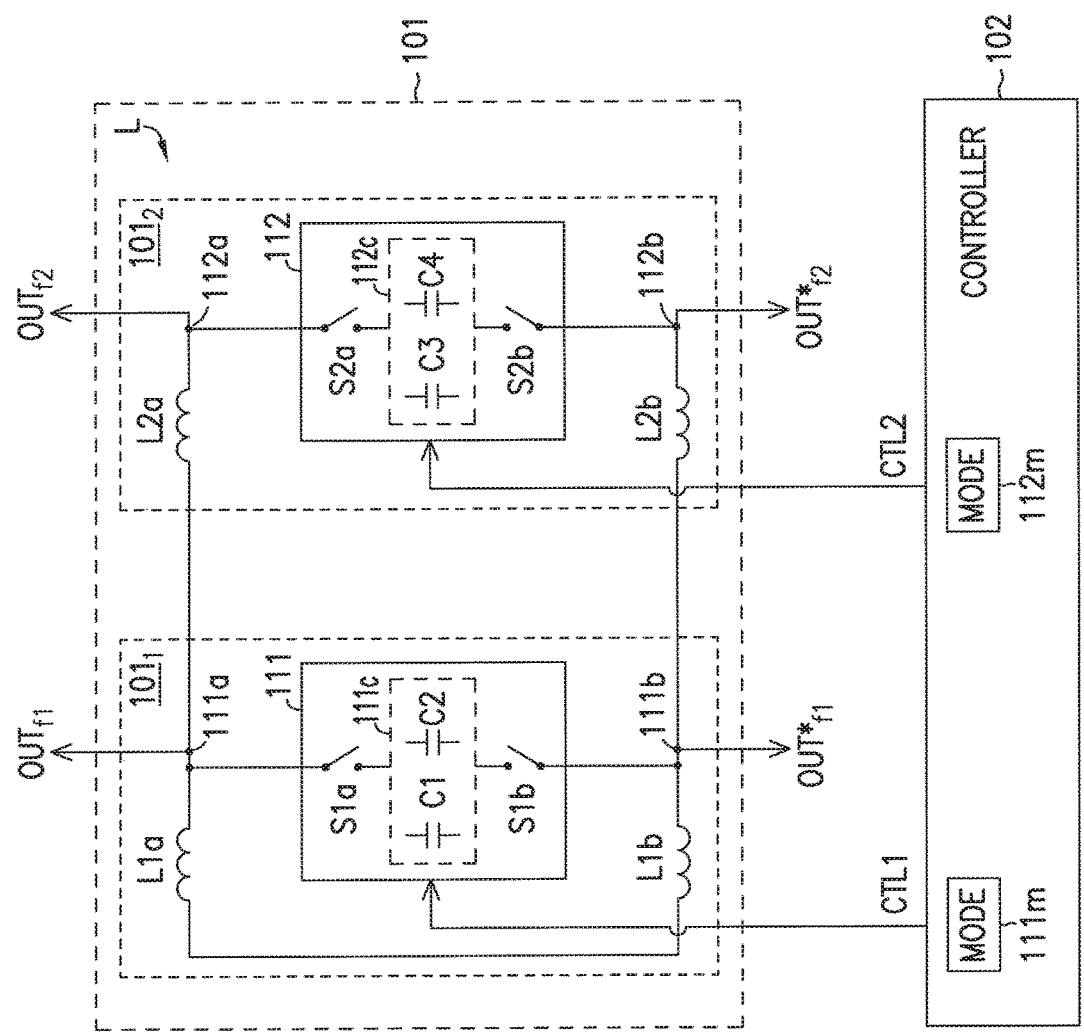
FIG. 1 shows a schematic diagram of an apparatus in the form of an integrated circuit (IC) device including oscillator circuitry and a controller, according to some embodiments described herein.

FIG. 1 shows a schematic diagram of an apparatus in the form of an integrated circuit (IC) device 100 including oscillator circuitry 101 and a controller 102, according to some embodiments described herein. The apparatus (which includes IC device 100) shown in FIG. 1 can include or be included in an electronic device or system, such as a computer (e.g., server, desktop, laptop, or notebook), a tablet, a cellular phone, or other electronic devices or systems. IC device 100 can be or can include an IC chip (e.g., a semiconductor chip). Examples of IC devices include a processor (e.g., a central processing unit (CPU), graphics controller, input/output controller, or memory controller), a memory device, a system-on-chip (SoC), and/or other electronic devices.

As shown in FIG. 1, oscillator circuitry 101 and controller 102 can be included in the same IC device 100. For example, IC device 100 can include (or can be included in) a chip (IC chip), such that oscillator circuitry 101 can be included in (e.g., formed in or formed on) the chip (on-chip oscillator circuitry 101), and controller 102 can also be included in (e.g., formed in or formed on) the same chip (on-chip controller 102) with oscillator circuitry 101.

One skilled in the art would readily recognize that an IC device (e.g., an IC device mentioned in the above examples) may include additional elements and circuitry. However, in order to not obscure the subject matter described herein, FIG. 1 omits such additional elements and circuitry.

As shown in FIG. 1, oscillator circuitry 101 can include oscillator $101_1$ and oscillator $101_2$. Each of oscillator $101_1$ and oscillator $101_2$ can be an inductor-capacitor (LC) oscillator. Oscillator $101_1$ can generate signals (e.g., oscillating signals) $OUT_{f1}$ and $OUT^*_{f1}$ at terminals (or nodes) 111a and 111b, respectively. Signals $OUT_{f1}$ and $OUT^*_{f1}$ can form a differential signal pair. Oscillator $101_2$ can generate signals (e.g., oscillating signals) $OUT_{f2}$, and $OUT^*_{f2}$ at terminals (or nodes) 112a and 112b, respectively. Signals $OUT_{f2}$ and $OUT^*_{f2}$ can form a differential signal pair. IC device 100 can have additional elements and circuitry (not shown, as mentioned above) that can use signal pair $OUT_{f1}/OUT^*_{f1}$ and signal pair $OUT_{f2}/OUT^*_{f2}$ during operations of such additional elements and circuitry. In FIG. 1, signals $OUT_{f1}$ and $OUT^*_{f1}$ can have the same frequency f1. Signals $OUT_{f2}$ and $OUT^*_{f2}$ can have the same frequency f2. However, frequencies f1 and f2 can be different frequencies. For example, frequency f1 can be greater than frequency f2. FIG. 1 shows an example where each of oscillator $101_1$ and oscillator $101_2$ can generate a signal pair (e.g., differential signal pair $OUT_{f1}/OUT^*_{f1}$ or differential signal pair $OUT_{f2}/OUT^*_{f2}$). However, each of oscillator $101_1$ and oscillator $101_2$ can generate a single-ended signal. For example, oscillator $101_1$ can generate either signal $OUT_{f1}$ or signal $OUT^*_{f1}$ (or alternatively either signal $OUT_{f1}$ or signal $OUT^*_{f1}$ is unused), and oscillator $101_2$ can generate either signal $OUT_{f2}$ or signal $OUT^*_{f2}$ (or alternatively either signal $OUT_{f2}$ or signal $OUT^*_{f2}$ is unused).

Controller 102 can operate to select between modes (e.g., operating modes) 111m and 112m during a particular time interval, depending on which signal pair between signal pairs $OUT_{f1}/OUT^*_{f1}$ and $OUT_{f2}/OUT^*_{f2}$ is to be used by IC device 100 during the particular time interval. Controller 102 can select modes 111m and 112m one at a time, such that either oscillator $101_1$ or oscillator $101_2$ (e.g., only one oscillator between oscillator $101_1$ and oscillator $101_2$) can be activated during a particular time interval in the operations of IC device 100. Thus, either signal pair $OUT_{f1}/OUT^*_{f1}$ or signal pair $OUT_{f2}/OUT^*_{f2}$ (e.g., only one signal pair between signal pairs $OUT_{f1}/OUT^*_{f1}$ and $OUT_{f2}/OUT^*_{f2}$) can be generated (by the activated oscillator) during a particular time interval in the operations of IC device 100.

For example, controller 102 can operate to select mode 111m if signal pair $OUT_{f1}/OUT_{f1}$ is to be used by IC device 100 during a time interval. Controller 102 provides information CTL1 (control information in the form of signals) to activate oscillator $101_1$ and cause oscillator $101_1$ to generate signal pair $OUT_{f1}/OUT^*_{f1}$. In this example, information CTL2 from controller 102 can cause oscillator $101_2$ to be deactivated or remain deactivated.

In another example, controller 102 can operate to select node 112m if signal pair $OUT_{f2}/OUT^*_{f2}$, is to be used by IC device 100 during another time interval, and then controller 102 provides information CTL2 (control information in the form of signals) to activate oscillator $101_2$ and cause oscillator $101_2$ to generate signal pair $OUT_{f2}/OUT^*_{f2}$. In this example, information CTL1 from controller 102 can cause oscillator $101_1$ to be deactivated or remain deactivated.

As shown in FIG. 1, oscillator circuitry 101 can include an inductor L formed by a combination of inductor portions L1a, L1b, L2a, and L2b (e.g., L2a+L1a+L1b+L2b) that can form a conductive path (e.g., a continuous current path) of inductor L. As shown and described in more detail below with reference to FIG. 3A, in the physical structure of inductor L, inductor portions L1a, L1b, L2a, and L2b of inductor L can be segments of the same conductive path of inductor L, in which the conductive path includes multiple turns (e.g., a continuous coil (e.g., metal spiral coil) having multiple turns).

In FIG. 1, oscillator $101_1$ and oscillator $101_2$ can share inductor L to generate respective signal pair $OUT_{f1}/OUT^*_{f1}$ or signal pair $OUT_{f2}/OUT^*_{f2}$ at different time intervals. For example, oscillator $101_1$ can use inductor portions L1a and L1b during a time interval to generate signal pair $OUT_{f1}/OUT^*_{f1}$, and oscillator $101_2$ can use inductor portions L2a and L2b during another time interval to generate signal pair $OUT_{f2}/OUT^*_{f2}$.

Oscillator $101_1$ can include a circuit 111 that can include circuitry (e.g., oscillator core circuitry) 111c and switches S1a and S1b. Circuitry 111c can include at least one capacitor, such as capacitors C1 and C2. Capacitors C1 and C2 can be combined with (e.g., coupled to) inductor portions L1a and L1b to form part of oscillator $101_1$, such as by forming an LC circuit (e.g., LC tank or resonance circuit) of oscillator $101_1$. Capacitors C1 and C2 can be variable (e.g., tunable) capacitors, such that the capacitances of capacitors C1 and C2 can be selected (e.g., tuned) in order to select the value (e.g., a predetermined value) for frequency f1 of signals $OUT_{f1}$ and $OUT*_{f1}$. FIG. 1 shows two capacitors C1 and C2 as an example. Circuitry 111c can include fewer or more than two capacitors. For example, circuitry 111c can include a capacitor bank that can include a single capacitor or multiple capacitors.

Circuitry 111c of oscillator 101₁ can also include transistors (not shown) to couple capacitors C1 and C2 to inductor portions L1a and L1b. One skilled in the art would readily recognize that such transistors of circuitry 111c can be coupled to inductor portions L1a and L1b and capacitors C1 and C2 to form the LC circuit (e.g., LC tank) of oscillator 101₁. For example, the transistors of circuitry 111c can be coupled to inductor portions L1a and L1b and capacitors C1 and C2 in ways known to those skilled in the art to form the LC circuit of oscillator 101₁ in order to generate an oscillating signal (e.g., a single-ended signal, such as signal $OUT_{f1}$ or $OUT*_{f1}$) or oscillating signals (e.g., a differential signal pair, such as signal pair $OUT_{f1}/OUT*_{f1}$).

Oscillator 101₂ can include a circuit 112 that can include circuitry (e.g., oscillator core circuitry) 112c and switches S2a and S2b. Circuitry 112c can include at least one capacitor, such as capacitors C3 and C4. Circuitry 112c can also include at least one transistor (not shown) to couple capacitors C3 and C4 to inductor portions L2a and L2b. Capacitors C3 and C4 can be combined with (e.g., coupled to) inductor portions L2a and L2b to form part of oscillator 101₂, such as by forming an LC circuit (e.g., LC tank or resonance circuit) of oscillator 101₂. Capacitors C3 and C4 can be variable (e.g., tunable) capacitors, such that the capacitances of capacitors C3 and C4 can be selected (e.g., tuned) in order to select the value (e.g., a predetermined value) for frequency f2 of signals $OUT_{f2}$ and $OUT*_{f2}$. FIG. 1 shows two capacitors C3 and C4 as an example. Circuitry 112c can include fewer or more than two capacitors. For example, circuitry 112c can include a capacitor bank that can include a single capacitor or multiple capacitors.

One skilled in the art would readily recognize that such transistors of circuitry 112c can be coupled to inductor portions L2a and L2b and capacitors C3 and C4 to form the LC circuit (e.g., LC tank) of oscillator 101₂. For example, the transistors of circuitry 112c can be coupled to inductor portions L2a and L2b and capacitors C3 and C4 in ways known to those skilled in the art to form the LC circuit of oscillator 101₂ in order to generate an oscillating signal (e.g., a single-ended signal, such as signal $OUT_{f2}$ or $OUT*_{f2}$) or oscillating signals (e.g., a differential signal pair, such as signal pair $OUT_{f2}/OUT*_{f2}$).

Thus, as shown in FIG. 1 and as described above, each of oscillators 101₁ and 101₂ has its own oscillation core (e.g., shown as circuitry 111c or 112c), and each oscillation core can have its own active transistor core to generates a negative transconductance (−gm) to compensate for the loss and the tuning capacitors (e.g., tuning capacitor array) included in circuitry 111c or 112c. By taking the smaller inductance (e.g., a portion of inductor L) for a higher target frequency and the larger inductance (e.g., another portion of inductor L) for a lower target frequency naturally, oscillator circuitry 101 (having shared inductor L) can provide two frequency bands associated with two modes 111m and 112m. The unused oscillation core can easily be isolated during mode 111m or 112m by being either powered down or turned off.

In FIG. 1, switches S1a, S1b, S2a, and S2b can be implemented as transistors. Switches S1a, S1b, S2a, and S2b can be controlled (e.g., turned on or turned off) by controller 102 such that switches S1a and S1b are turned off (or remain turned off) when switches S2a and S2b are turned on, and such that switches S2a and S2b are turned off (or remain turned off) when switches S1a and S1b are turned on. Controlling (e.g., turning on or turning off) switches S1a, S1b, S2a, and S2b this way allows signal pair $OUT_{f1}/OUT*_{f1}$ and signal pair $OUT_{f2}/OUT*_{f2}$ to be generated at different time intervals (e.g., signal pair $OUT_{f1}/OUT*_{f1}$ and signal pair $OUT_{f2}/OUT*_{f2}$ are not concurrently generated). Controlling (e.g., turning on or turning off) switches S1a, S1b, S2a, and S2b this way also electrically isolates the LC circuit associated with the unused portion of inductor L from the used portion of inductor L. This can prevent (or reduce) the unused portion of inductor L from impacting the operation of the LC circuit associated with the used portion of inductor L.

As an example, when mode 111m is selected, switches S1a and S1b can be turned on and at least one (one or both) of switches S2a and S2b can be turned off. Turned-on switches S1a and S1b electrically couple circuit 111 of oscillator 101₁ to terminals 111a and 111b and allow oscillator 101₁ to generate signals $OUT_{f1}$ and $OUT*_{f1}$ at terminals 111a and 111b, respectively. In this example, turned-off switches S2a and S2b electrically decouple circuit 112 of oscillator 101₂ from terminals 112a and 112b. Thus, signal pair $OUT_{f2}/OUT*_{f2}$ is not generated by oscillator 101₂.

In another example, when mode 112m is selected, switches S2a and S2b can be turned on and at least one (one or both) of switches S1a and S1b can be turned off. Turned-on switches S2a and S2b electrically couple circuit 112 of oscillator 101₂ to terminals 112a and 112b and allow oscillator 101₂ to generate signals $OUT_{f2}$ and $OUT*_{f2}$ at terminals 112a and 112b, respectively. In this example, turned-off switches S1a and S1b electrically decouple circuit 111 of oscillator 101₁ from terminals 111a and 111b. Thus, signal pair $OUT_{f1}/OUT*_{f1}$ is not generated by oscillator 101₁.

FIG. 2A and FIG. 2B are timing diagrams for respective signal pairs $OUT_{f1}/OUT*_{f1}$ and $OUT_{f2}/OUT*_{f2}$, according to some embodiments described herein. As shown in FIG. 2A, signals $OUT_{f1}$ and $OUT*_{f1}$ can be complementary signals (e.g., inverted versions of each other), such that signals $OUT_{f1}$ and $OUT*_{f1}$ can form a differential signal pair. As shown in FIG. 2B, signals $OUT_{f2}$ and $OUT*_{f2}$ can be complementary signals (e.g., inverted versions of each other), such that signals $OUT_{f2}$ and $OUT*_{f2}$ can form a differential signal pair.

Signals $OUT_{f1}$ and $OUT*_{f1}$ can be generated during a time interval from time Ta to time Tb. Signals $OUT_{f2}$ and $OUT*_{f2}$ can be generated during a time interval from time Tc to time Td. The time interval from time Ta to time Tb is different from (e.g., occurring either before or after) the time interval from time Tc to time Td.

The time interval from time Ta to time Tb can occur during the time interval that mode 111m is selected by controller 102 (FIG. 1). The time interval from time Tc to time Td can occur during the time interval that mode 112m is selected by controller 102.

As shown in FIG. 2A and FIG. 2B, each of signals $OUT_{f1}$, $OUT*_{f1}$, $OUT_{f2}$, and $OUT*_{f2}$ is an oscillating (e.g., periodical) signal. Signals $OUT_{f1}$ and $OUT*_{f1}$ can have the same amplitude and the same frequency f1. Signals $OUT_{f2}$ and $OUT*_{f2}$ can have the same amplitude and the same frequency f2. Signals $OUT_{f1}$, $OUT*_{f1}$, $OUT_{f2}$, and $OUT*_{f2}$ can have the same amplitude.

Figure 3A:
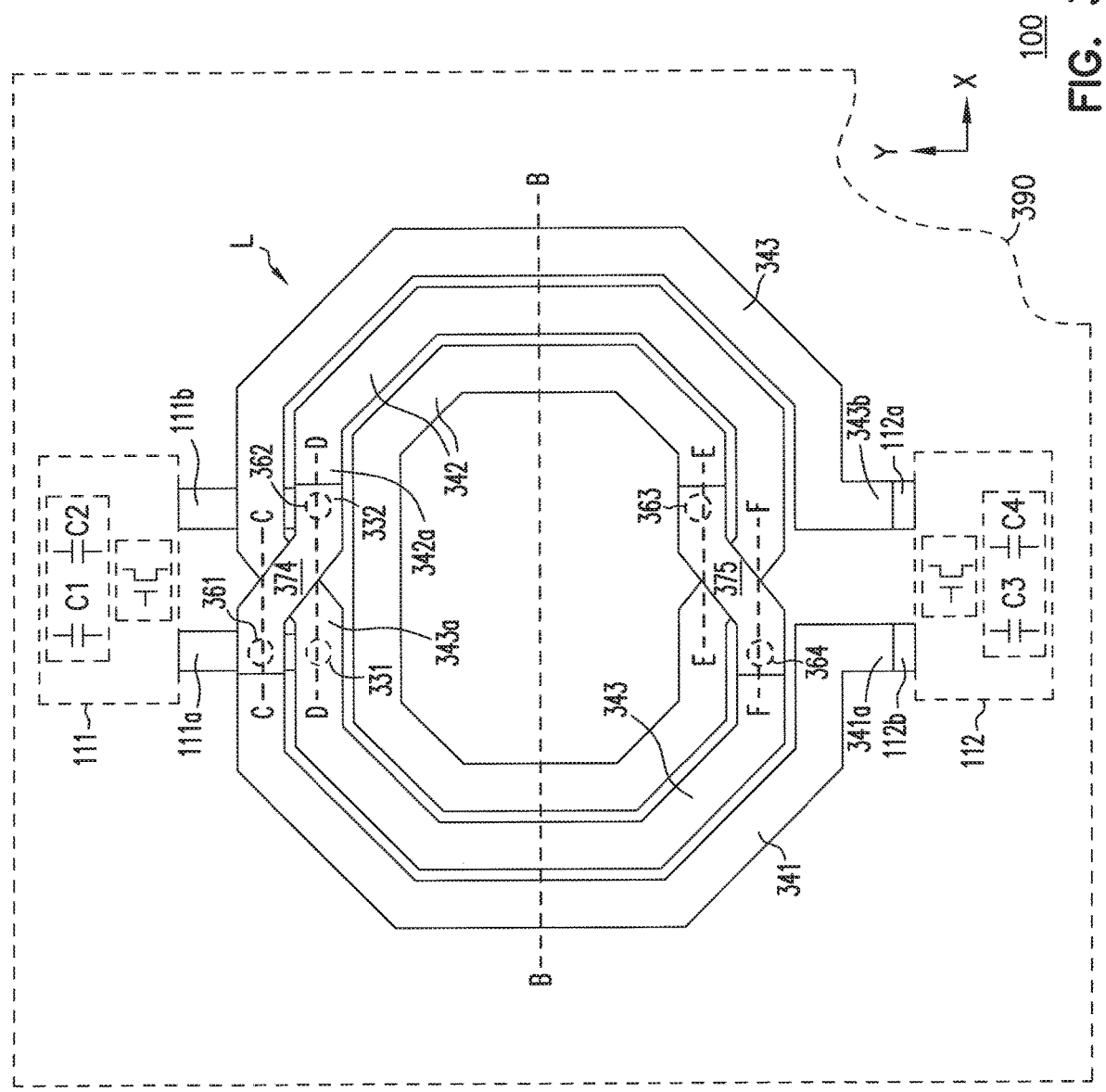
FIG. 3A shows a portion of the IC device of FIG. 1 including a structure (e.g., top view) of an inductor of the oscillator circuitry of the IC device, according to some embodiments described herein.

FIG. 3A shows a portion of IC device 100 including a structure (e.g., top view) of inductor L and circuits 111 and 112 of FIG. 1, according to some embodiments described herein. As shown in FIG. 3A, inductor L can be located on (e.g., formed over) a substrate (e.g., a semiconductor substrate) 390 of IC device 100. For example, inductor L can be formed over an area defined by the x-direction and the y-direction (e.g., from a top view). Inductor L can include a conductive path, which can include a path from terminal 112b continuously going through different segments 341, 374, 342, 375, and 343, and then to terminal 112a Segments 341, 374, 342, 375, and 343 are conductive segments (which include conductive materials) formed over substrate 390.

Segments 341, 374, 342, 375, and 343 are electrically in contact (electrically connected) with each other. Segment 374 serves as a bridge that electrically connects segment 341 (through a via 361) to segment 342 (through a via 362). Segment 374 goes over a portion of segment 343. Segment 375 serves as a bridge that electrically connects segment 342 (through a via 363) to segment 343 (through a via 364). Segment 375 goes over a portion of segment 342.

The conductive path of inductor L can include (e.g., can be formed from) a conductive material (or conductive materials) that include metal (e.g., a single metal), alloy (e.g., a combination of metals), or other conductive materials. Thus, segments 341, 374, 342, 375, and 343 are also conductive segments that are formed from conductive material (or conductive materials).

The conductive path (e.g., formed by segments 341, 374, 342, 375, and 343) of inductor L can have a spiral shape (e.g., a spiral coil), such that the conductive path of inductor L can include multiple turns. Each of segments 341, 374, 342, 375, and 343 can include a single turn, less than a single turn, or more than one turn. The turns of segments 341, 374, 342, 375, and 343 combine to form the total turns of inductor L. FIG. 3A shows an example where inductor L includes a total of three turns (e.g., the three turns can be counted from terminal 112a going through segments 341, 374, 342, 375, and 343 and then coming back to terminal 112b). However, inductor L can have a different number of turns. A variation of inductor L (inductor L', having five turns) is shown and described in detail with reference to FIG. 6 and FIG. 8.

As shown in FIG. 3A, terminals 111a and 111b of circuit 111 and terminals 112a and 112b of circuit 112 can be coupled to (e.g., in electrical contact with) the conductive path of inductor L at different locations (e.g., different tap points). Each of terminals 111a, 111b, 112a, and 112b can include a piece of material (e.g., metal) coupled to the conductive path of inductor L at different locations (e.g., different tap points). For example, terminal 111a of circuit 111 can be coupled to the conductive path of inductor L (through a via 331) at a location (e.g., tap point) 343a of segment 343, and terminal 111b of circuit 111 can be coupled to the conductive path of inductor L (through a via 332, hidden under via 362) at a location (e.g., tap point) 342a of segment 342. In another example, terminal 112a of circuit 112 can be coupled to the conductive path of inductor L at a location (e.g., tap point) 343b of segment 343, and terminal 112b of circuit 112 can be coupled to the conductive path of inductor L at a location (e.g., tap point) 341a of segment 341.

As shown in FIG. 3A, circuits 111 and 112 can be located on (e.g., formed in or formed over) substrate 390. For simplicity, some of the physical circuit elements (e.g., switches) of circuits 111 and 112 are not shown in detail in FIG. 3A, and some other elements (e.g., transistors and capacitors) of circuits 111 and 112 are symbolically shown (e.g., shown as transistor and capacitor symbols) in FIG. 3A. Lines B-B, C-C, D-D, E-E, and F-F in FIG. 3A are sectional lines marking different portions (e.g., side views) of inductor L shown in FIG. 3B through FIG. 3F, respectively.

FIG. 3B shows a side view (e.g., cross-section) of a portion of inductor L along line B-B of FIG. 3A. In FIG. 3B (and also in FIG. 3C through FIG. 3F), the z-direction can be a direction perpendicular to substrate 390 (e.g., a vertical direction with respect to substrate 390). The z-direction and the x-direction are perpendicular to each other. As shown in FIG. 3B, segments 341, 342, and 343 (e.g., the materials of segments 341, 342, and 343) can be formed on the same level, such as a level 381 over substrate 390 of IC device 100. Level 381 is an internal level (e.g., conductive routing level (e.g., metal level)) of IC device 100.

FIG. 3C shows a side view (e.g., cross-section) of a portion of inductor L along line C-C of FIG. 3A. As shown in FIG. 3C, terminal 111a (e.g., the material of terminal 111a) can be formed in a level 380 over substrate 390 of IC device 100. The material (e.g., metal) of terminal 111a can be a piece (e.g., a conductive segment) of material that can extend horizontally in level 380. Level 380 is an internal level of IC device 100. Level 380 is below level 381, such that level 380 is between level 381 and substrate 390. As shown in FIG. 3C, segment 341 (formed on level 381) goes over a portion of terminal 111a (formed on level 380), such that terminal 111a is electrically uncoupled to (e.g., not in electrical contact with) segment 341.

Segment 374 can be formed in a level 382, which is different from level 380 and level 381. IC device 100 can include via 361 (e.g., a through-hole between levels 381 and 382 that can extend in the z-direction), and a conductive material (e.g., metal) 361a inside via 361. Conductive material 361a is electrically in contact with segment 341 (formed in level 381) and segment 374 (formed in level 382). Thus, conductive material 361a can be a vertical segment of the conductive path of inductor L that electrically couples two horizontal segments (e.g., segments 341 and 374) of the conductive path of inductor L.

FIG. 3D shows a side view (e.g., cross-section) of a portion of inductor L along line D-D of FIG. 3A. As shown in FIG. 3D, IC device 100 can include via 331 (e.g., a through-hole between levels 380 and 381 that can extend in the z-direction), and a conductive material (e.g., metal) 331a inside via 331. Conductive material 331a is electrically in contact with segment 343 (formed in level 381) and terminal 111a (formed in level 380). Thus, conductive material 331a can be a vertical segment of the conductive path of inductor L that electrically couples two horizontal segments (e.g., segment 343 and the segment of terminal 111a) of the conductive path of inductor L.

As shown in FIG. 3D, terminal 111b the material of terminal 111b) can be formed in level 380. The material (e.g., metal) of terminal 111b can be a piece (e.g., a conductive segment) of material that can extend horizontally in level 380. IC device 100 can include via 332 (e.g., a through-hole between levels 380 and 381 that can extend in the z-direction), and a conductive material (e.g., metal) 332a inside via 332. Conductive material 332a is electrically in contact with segment 342 (formed in level 381) and terminal 111b (formed in level 380). Thus, conductive material 332a can be a vertical segment of the conductive path of inductor L that electrically couples two horizontal segments (e.g., segment 342 and the segment of terminal 111b) of the conductive path of inductor L.

As shown in FIG. 3D, IC device 100 can include via 362 (e.g., a through-hole between levels 381 and 382 that can extend in the z-direction), and a conductive material (e.g., metal) 362a inside via 362. Conductive material 362a is electrically in contact with segment 342 (formed in level 381) and segment 374 (formed in level 382). Thus, conductive material 362a can be a vertical segment of the conductive path of inductor L that electrically couples two horizontal segments (e.g., segments 342 and 374) of the conductive path of inductor L.

FIG. 3E shows a side view (e.g., cross-section) of a portion of inductor L along line E-E of FIG. 3A. Segment 375 can be formed in level 382 (which is the same level where segment 374 (FIG. 3C) is formed). As shown in FIG. 3E, IC device 100 can include via 363 (e.g., a through-hole between levels 381 and 382 that can extend in the z-direction), and a conductive material (e.g., metal) 363a inside via 363. Conductive material 363a is electrically in contact with segment 342 (formed in level 381) and segment 375 (formed in level 382). Thus, conductive material 363a can be a vertical segment of the conductive path of inductor L that electrically couples two horizontal segments (e.g., segments 342 and 375) of the conductive path of inductor L.

FIG. 3F shows a side view (e.g., cross-section) of a portion of inductor L along line F-F of FIG. 3A. As shown in FIG. 3F, IC device 100 can include via 364 (e.g., a through-hole between levels 381 and 382 that can extend in the z-direction), and a conductive material (e.g., metal) 364a inside via 364. Conductive material 364a is electrically in contact with segment 343 (formed in level 381) and segment 375 (formed in level 382). Thus, conductive material 364a can be a vertical segment of the conductive path of inductor L that electrically couples two horizontal segments (e.g., segments 343 and 375) of the conductive path of inductor L.

Figure 4B:
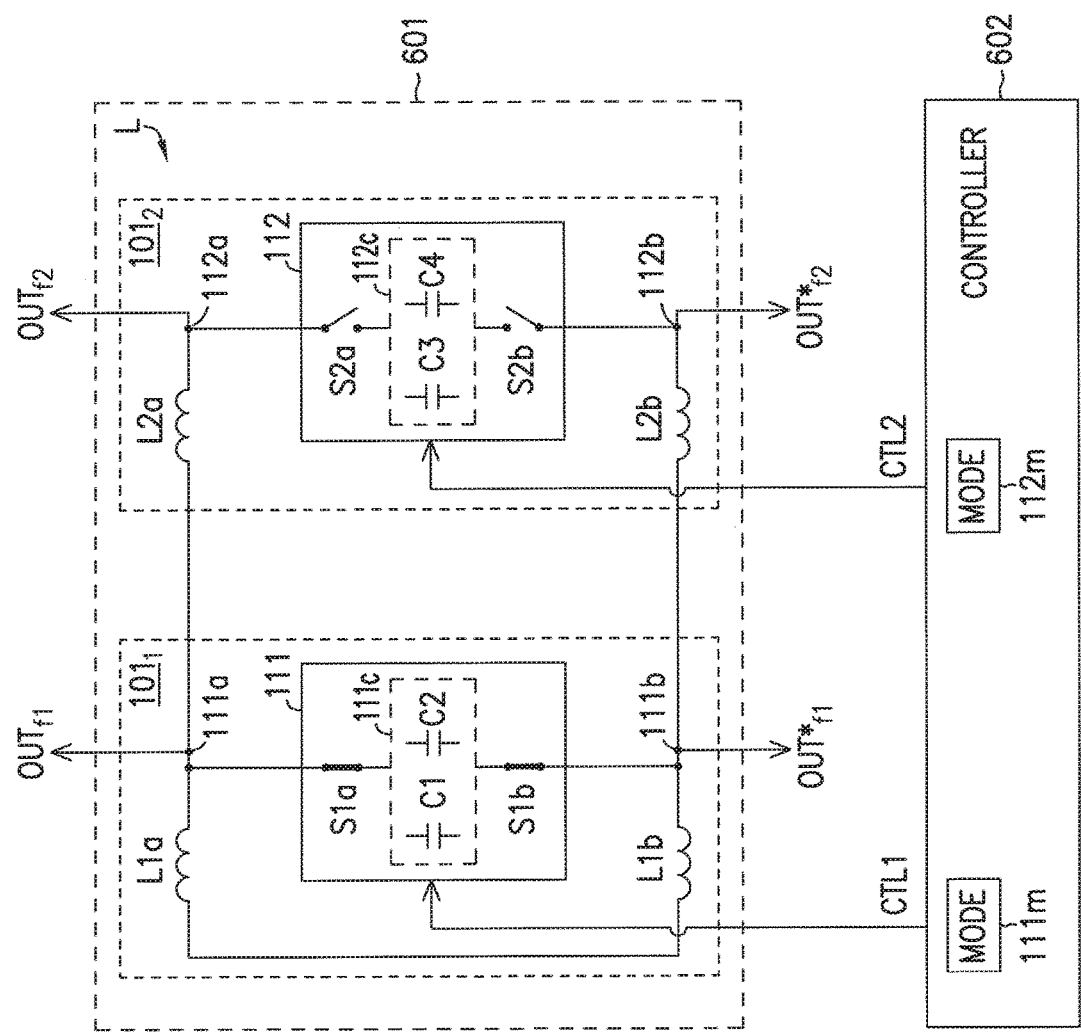
FIG. 4B shows the schematic diagram of FIG. 1 corresponding to the mode of the IC device of FIG. 4A where some switches of an oscillator of the IC device are turned on (e.g., closed) and other switches of another oscillator are turned off (e.g., open).

FIG. 4A shows a circuit path (e.g., current path) 411 in inductor L of FIG. 3A during an example operation of IC device 100 where mode 111m is selected (e.g., mode 112m is not selected), according to some embodiments described herein. FIG. 4B shows the schematic diagram of FIG. 1 corresponding to the mode of IC device 100 of FIG. 4A where switches S1a and S1b are turned on (e.g., closed) and switches S2a and S2b are turned off (e.g., open) in response to mode 111m being selected and mode 112m not being selected. Based on the schematic diagram of FIG. 4F, only inductor portions L1a and L1b of inductor L are used (in combination with circuit 111) to generate signal pair $OUT_{f1}$/$OUT^*_{f1}$. Portions L2a and L2b of inductor L are unused. Thus, circuit path 411 in FIG. 4A can include a portion (e.g., two turns (represented by inductor portions L1a and L1b)) of the total turns (e.g., three turns) of inductor L. Therefore, as shown in FIG. 4A, circuit path 411 can be formed between terminals 111a and 111b of oscillator $101_1$ in the segments (e.g., segment 342 and part of segment 343) that are represented by inductor portions L1a and L1b (FIG. 4B). As shown in FIG. 4B, since switches S2a and S2b are turned off, signal pair $OUT_{f2}$/$OUT^*_{f2}$ at respective terminals 112a and 112b of oscillator $101_2$ is not generated.

Figure 5A:
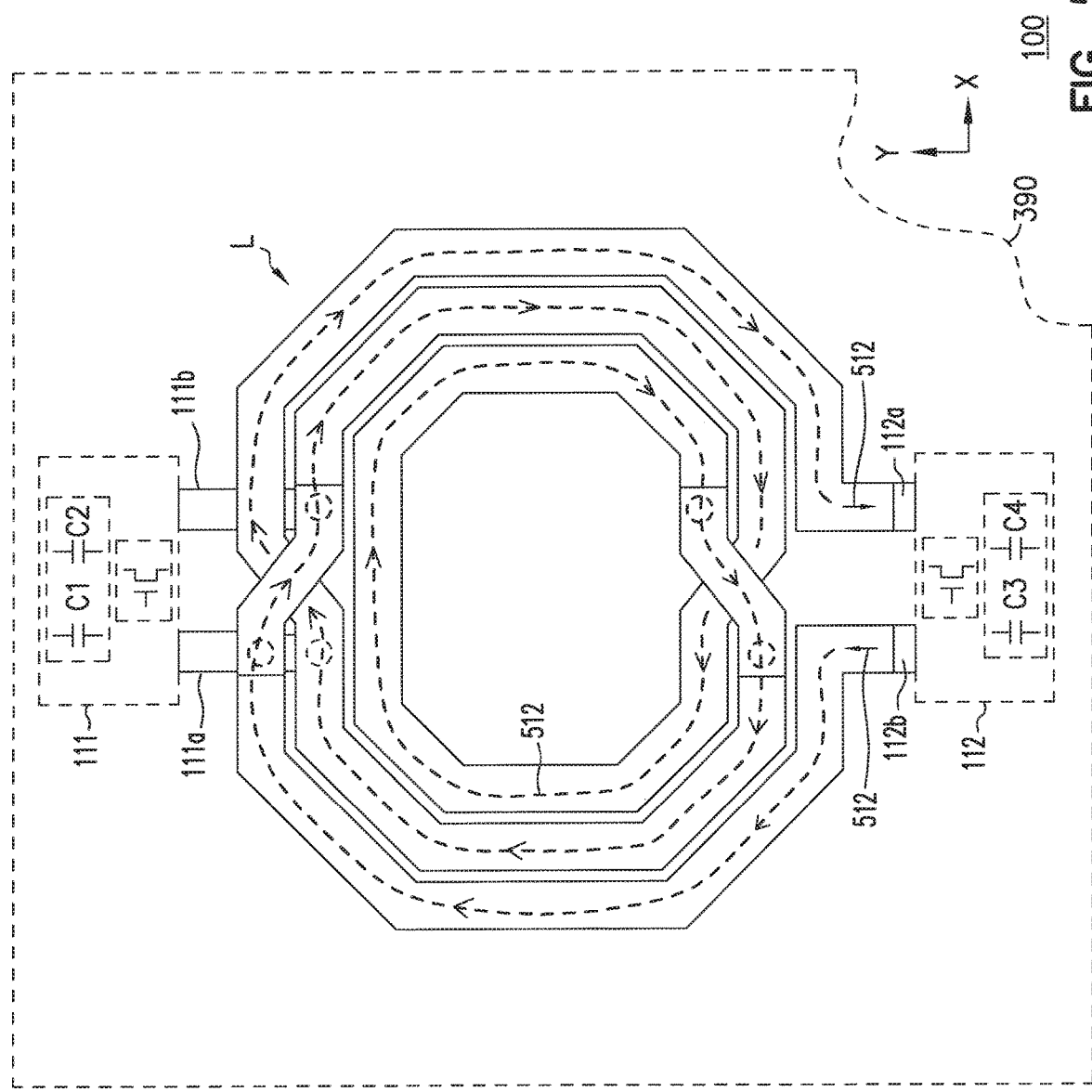
FIG. 5A shows a circuit path (e.g., current path) in the inductor of the IC device of FIG. 3A during an example operation of the IC device where another mode is selected, according to some embodiments described herein.
Figure 5B:
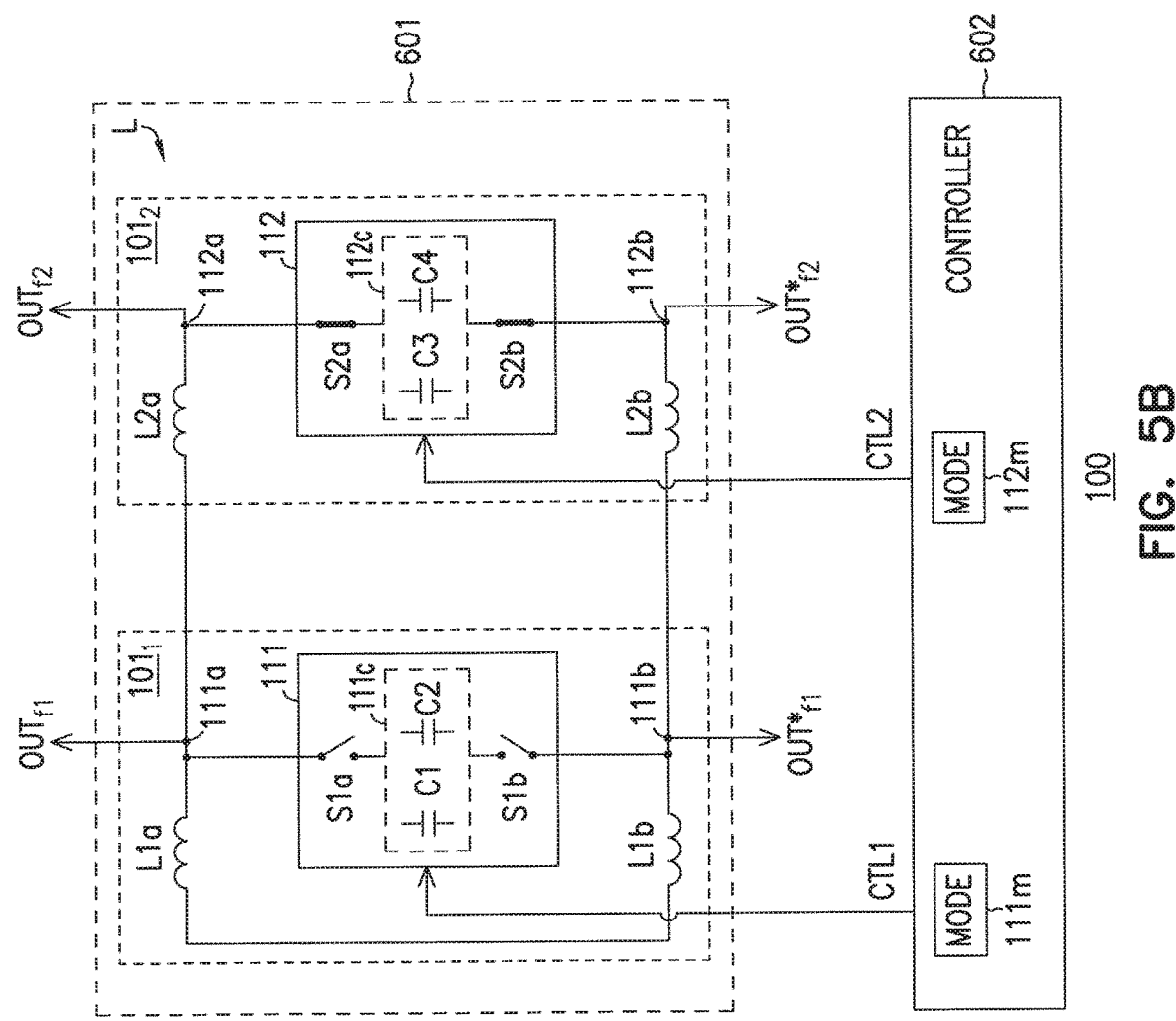
FIG. 5B shows the schematic diagram of FIG. 1 corresponding to the mode of the IC device of FIG. 5A where some switches of an oscillator of the IC device are turned off (e.g., open) and other switches of another oscillator are turned on (e.g., closed).

FIG. 5A shows a circuit path (e.g., current path) 512 in inductor L of FIG. 3A during an example operation of IC device 100 where mode 112m is selected (e.g., mode 111m (FIG. 1) is not selected), according to some embodiments described herein. FIG. 5B shows the schematic diagram of FIG. 1 corresponding to the mode of IC device 100 of FIG. 5A where switches S2a and S2b are turned on (e.g., closed) and switches S1a and S1b are turned off (e.g., open) in response to mode 112m being selected and mode 111m not being selected. Based on the schematic diagram of FIG. 5B, all of the portions of inductor L (e.g., inductor portions L2a, L1a, L1b, and L2b) are used (in combination with circuit 112) to generate signal pair $OUT_{f2}$/$OUT^*_{f2}$. Thus, circuit path 512 in FIG. 5A can include all the turns (e.g., three turns (represented by inductor portions L2a, L1a, L1b, and L2b)) of the total turns (e.g., three turns) of inductor L. Therefore, as shown in FIG. 5A, circuit path 512 can be formed between terminals 112a and 112b of oscillator $101_2$ in the segments (e.g., segments 341, 342, and 343) that are represented by inductor portions L2a, L1a, L1b and L2b (FIG. 5B). As shown in FIG. 5B, since switches S1a and S1b are turned off, signal pair $OUT_{f1}$/$OUT^*_{f1}$ at respective terminals 111a and 111b of oscillator $101_1$ is not generated.

The description above with reference to FIG. 1 through FIG. 5B describes an IC device 100 that includes multiple oscillators (e.g., oscillator $101_1$ and oscillator $101_2$) sharing an inductor (e.g., inductor L). The multiple oscillators can generate different signals (e.g., signal pair $OUT_{f1}$/$OUT^*_{f1}$ and signal pair $OUT_{f2}$/$OUT^*_{f2}$) that have different frequencies.

The structure and operation of IC device 100 have improvements and benefits over some conventional devices. For example, as previously mentioned, some conventional devices may include different oscillators that have different inductors, where the inductors have separate coils. In such devices, the portion (e.g., area) of the device used to form such separate coils can be relatively large. Thus, for a given device area, conventional oscillators may limit the remaining area of the device for other components to be formed in the device.

In IC device 100, as described above with reference to FIG. 1 through FIG. 5B, the area for oscillators $101_1$ and $101_2$ can be smaller in comparison with some conventional devices (e.g., devices having oscillators that have separate inductor coils). Other improvements and benefits of IC device 100 include improved (e.g., better) power consumption and phase noise performance in comparison with some other conventional devices (e.g., devices having oscillators that have inductor coils with serial switches).

The description above with reference to FIG. 1 through FIG. 5B shows an example where an inductor (e.g., inductor L) can be structured (e.g., formed) to allow two oscillators (e.g., oscillator $101_1$ and oscillator $101_2$) to share the inductor and generate two signal pairs (e.g., signal pair $OUT_{f1}$/$OUT^*_{f1}$ and signal pair $OUT_{f2}$/$OUT^*_{f2}$) at different times, where the signal pairs can have different frequencies. However, a variation of inductor L can be formed to allow more than two oscillators to share the inductor and generate more than two signal pairs at different times, where the signal pairs can have different frequencies.

Figure 6:
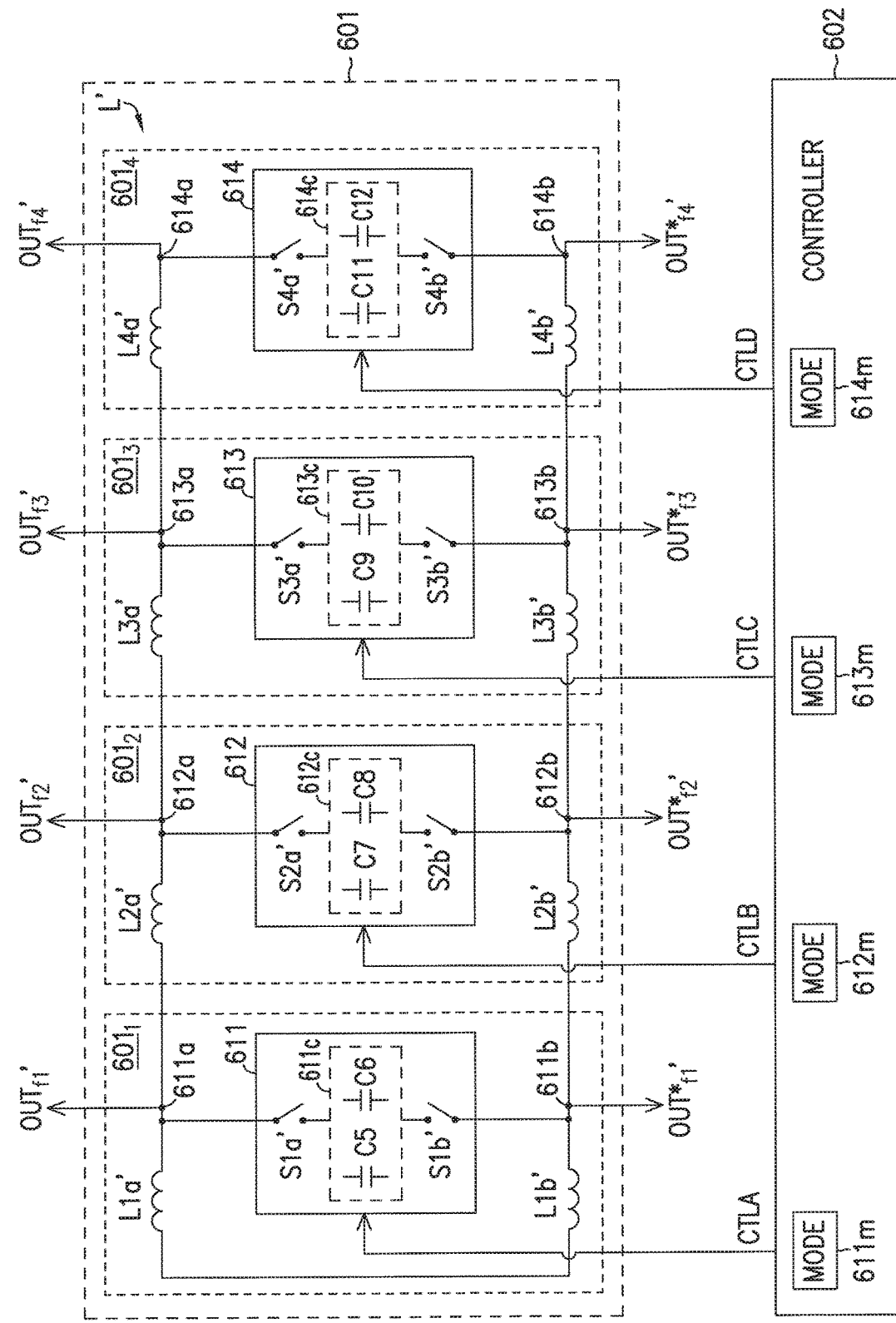
FIG. 6 shows a schematic diagram of an apparatus in the form of an IC device including oscillator circuitry having more than two oscillators, according to some embodiments described herein.
Figure 7A:
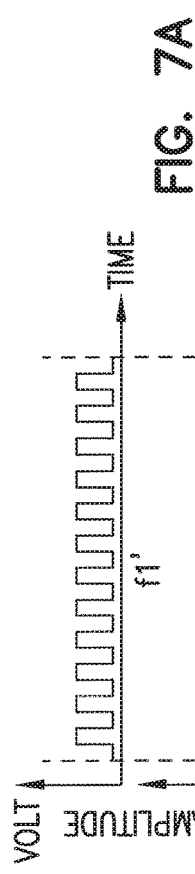
FIG. 7A, FIG. 7B, FIG. 7C, and FIG. 7D are timing diagrams for respective signal pairs of the oscillator circuitry of FIG. 6, according to some embodiments described herein.
Figure 7B:
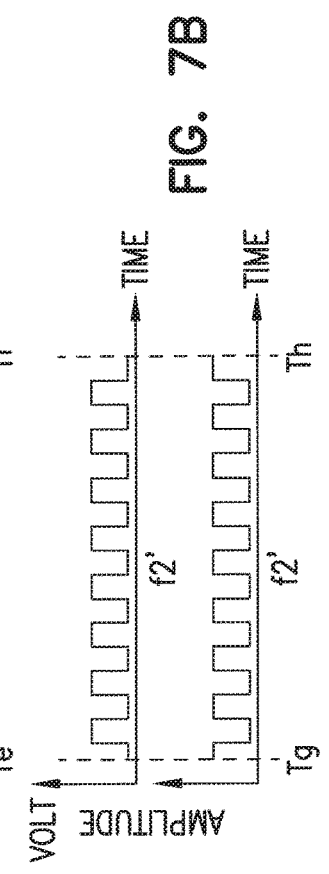
Figure 7C:
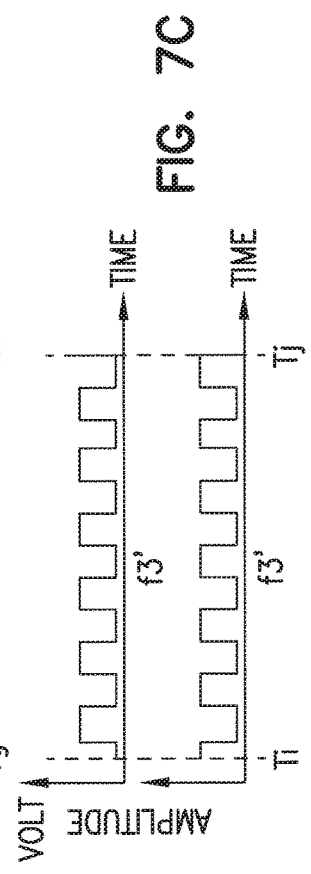
Figure 7D:
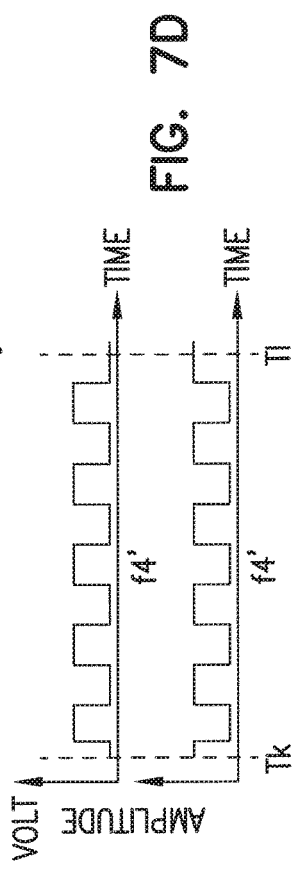

FIG. 6 shows a schematic diagram of an apparatus in the form of an IC device 600 including a controller 602 and oscillator circuitry 601 having more than two oscillators, according to some embodiments described herein. Oscillator circuitry 601 can be included in (e.g., formed in or formed on) the same chip (e.g., as on-chip oscillator circuitry 601) with controller 602.

Figure 8:
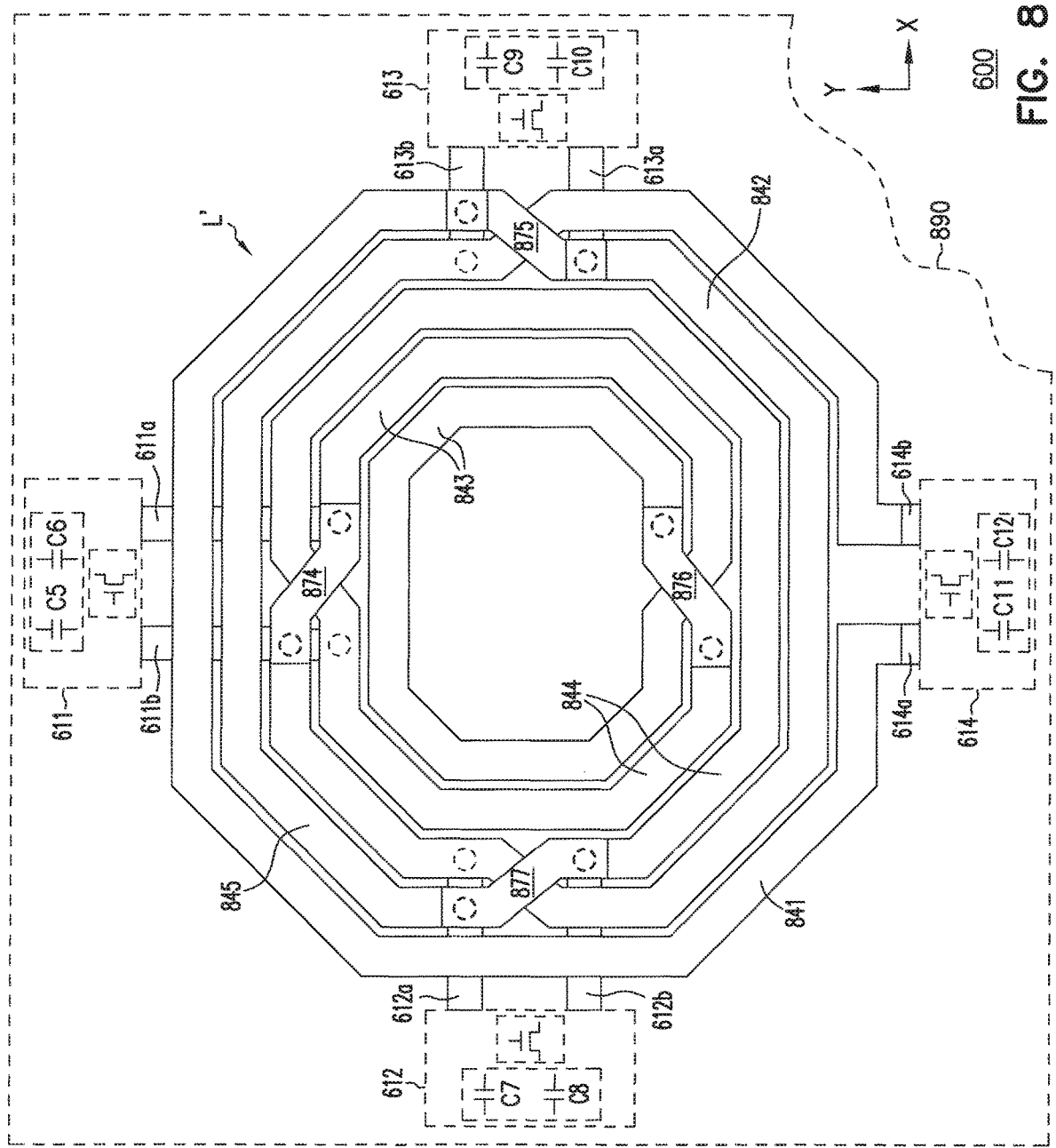
FIG. 8 shows a portion of the IC device of FIG. 6 including a structure top view) of an inductor L' of the oscillator circuitry of the IC device, according to some embodiments described herein.

IC device 600 can be a variation of IC device 100 (FIG. 1). For example, IC device 600 can include multiple (e.g., four) oscillators $601_1$, $601_2$, $601_3$, and $601_4$ (LC oscillators) that share an inductor L'. Inductor L' (the structure of which is shown in FIG. 8) can have more turns than inductor L (shown in FIG. 3A).

As shown in FIG. 6, oscillator $601_1$ can generate signals (e.g., oscillating signals) $OUT_{f1}'$ and $OUT^*_{f1}'$ (e.g., a differential signal pair) at terminals (or nodes) 611a and 611b, respectively. Oscillator $601_2$ can generate signals (e.g., oscillating signals) $OUT_{f2}'$ and $OUT^*_{f2}'$ (e.g., a differential signal pair) at terminals (or nodes) 612a and 612b, respectively. Oscillator $601_3$ can generate signals (e.g., oscillating signals) $OUT_{f3}'$ and $OUT^*_{f3}'$ (e.g., a differential signal pair) at terminals (or nodes) 613a and 613b, respectively. Oscillator 601$_4$ can generate signals (e.g., oscillating signals) OUT$_{f4}$' and OUT*$_{f4}$' (e.g., a differential signal pair) at terminals (or nodes) 614a and 614b, respectively.

Signal pair OUT$_{f1}$'/OUT*$_{f1}$' can have a frequency f1'. Signal pair OUT$_{f2}$'/OUT*$_{f2}$' can have a frequency f2'. Signal pair OUT$_{f3}$'/OUT*$_{f3}$' can have a frequency f3'. Signal pair OUT$_{f4}$'/OUT*$_{f4}$' can have a frequency f4'. Frequencies f1', f2', f3', and f4' can be different from each other. For example (as also shown in FIG. 7A through FIG. 7D), frequency f1' can be greater than frequency f2'; frequency f2' can be greater than frequency f3'; and frequency f3' can be greater than frequency f4'. FIG. 6 shows an example where each of oscillator 601$_1$, oscillator 601$_2$, oscillator 601$_3$, and oscillator 601$_4$ can generate a differential signal pair. However, each of oscillator 601$_1$, oscillator 601$_2$, oscillator 601$_3$, and oscillator 601$_4$ can generate a single-ended signal.

Controller 602 can operate to select one of modes (e.g., operating modes) 611m, 612m, 613m, and 614m during a particular time interval, depending on which signal pair among signal pairs OUT$_{f1}$'/OUT*$_{f1}$', OUT$_{f2}$'/OUT*$_{f2}$', OUT$_{f3}$'/OUT*$_{f3}$', and OUT$_{f4}$'/OUT*$_{f4}$' is to be used by IC device 100 during the particular time interval. Controller 602 can select modes 611m, 612m, 613m, and 614m one at a time, such that one of (e.g., only one of) signal pairs OUT$_{f1}$'/OUT*$_{f1}$', OUT$_{f2}$'/OUT*$_{f2}$', OUT$_{f3}$'/OUT*$_{f3}$', and OUT$_{f4}$'/OUT*$_{f4}$' can be generated during a particular time interval in the operations of IC device 100. For example, controller 602 can operate to select mode 611m if signal pair OUT$_{f1}$'/OUT*$_{f1}$' is to be used by IC device 600 during a time interval, and then controller 602 provides information CTLA (control information in the form of signals) to activate oscillator 601$_1$ and cause oscillator 601$_1$ to generate signal pair OUT$_{f1}$'/OUT*$_{f1}$'. In this example, information CTLB, CTLC, and CTLD from controller 602 can cause oscillator 601$_2$, oscillator 601$_3$, and oscillator 601$_4$ to be deactivated or remain deactivated.

In another example, controller 602 can operate to select mode 613m if signal pair OUT$_{f3}$'/OUT*$_{f3}$' is to be used by IC device 600 during another time interval, and then controller 602 provides information CTLC (control information in the form of signals) to activate oscillator 601$_3$ and cause oscillator 601$_3$ to generate signal pair OUT$_{f3}$/OUT*$_{f3}$'. In this example, information CTLA, CTLB, and CTLD from controller 602 can cause oscillator 601$_1$, oscillator 601$_2$, and oscillator 601$_4$ to be deactivated or remain deactivated.

As shown in FIG. 6, inductor L' can be formed by a combination of inductor portions L1a', L1b', L2a', L2b', L3a', L3b', L4a', and L4b' (e.g., L=L1a'+L1b'+L2a'+L2b'+ L3a'+L3b'+L4a'+L4b'). In the physical structure (shown in FIG. 8) of inductor L', conductive segments represented by inductor portions L1a', L1b', L2a', L2b', L3a', L3b', L4a', and L4b' (FIG. 6) can form a conductive path (e.g., current path) having multiple turns (e.g., a continuous coil (e.g., metal spiral coil) having multiple turns).

In FIG. 6, oscillator 601$_1$, oscillator 601$_2$, oscillator 601$_3$, and oscillator 601$_4$ can share inductor L' to generate respective signal pairs OUT$_{f1}$'/OUT*$_{f1}$', OUT$_{f2}$'/OUT*$_{f2}$', OUT$_{f3}$'/OUT*$_{f3}$', and OUT$_{f4}$'/OUT*$_{f4}$' at different time intervals. For example, oscillator 601$_1$ can use inductor portions L1a' and L1b' during a time interval to generate signal pair OUT$_{f1}$/OUT*$_{f1}$; oscillator 601$_2$ can use inductor portions L2a' and L2b' during another time interval to generate signal pair OUT$_{f2}$'/OUT*$_{f2}$'; oscillator 601$_3$ can use inductor portions L3a' and L3b' during another time interval to generate signal pair OUT$_{f3}$'/OUT*$_{f3}$'; and oscillator 601$_4$ can use inductor portions L4a' and L4b' during another time interval to generate signal pair OUT$_{f4}$'/OUT*$_{f4}$'.

As shown in FIG. 6, oscillator 601$_1$, oscillator 601$_2$, oscillator 601$_3$, and oscillator 601$_4$ can include respective circuits 611, 612, 613, and 614, each of which can include respective circuitry (e.g., oscillator core circuitry) 611c, 612c, 613c, or 614c. Circuits 611, 612, 613, and 614 can also include respective switches S1a' and S1b', S2a' and S2b', S3a' and S3b', and S4a' and S4b'. Circuitry 611c, 612c, 613c, and 614c can also include respective capacitors C5, C6, C7, C8, C9, C10, C11, and C12.

Switches S1a' and S1b', S2a' and S2b', S3a' and S3b', and S4a' and S4b' can be controlled (e.g., turned on or turned off) by controller 602 such that only two switches of one of oscillator 601$_1$, oscillator 601$_2$, oscillator 601$_3$, and oscillator 601$_4$ are turned on, and the switches of the other oscillators are turned off or remain turned off. This allows only one of signal pairs OUT$_{f1}$'/OUT*$_{f1}$', OUT$_{f2}$'/OUT*$_{f2}$', OUT$_{f3}$'/OUT*$_{f3}$', and OUT$_{f4}$'/OUT*$_{f4}$' to be generated during a particular time interval.

As an example, when mode 613m is selected, switches S3a' and S3b' are turned on to electrically couple circuit 613 to terminals 613a and 613b, and the rest of the switches (e.g., switches S1a' and S1b', S2a' and S2b', and S4a' and S4b') can be turned off (or remain turned off). Thus, in this example, circuit 613 is electrically coupled to terminals 613a and 613b to allow oscillator 601$_3$ to generate signal pair OUT$_{f3}$'/OUT*$_{f3}$' at terminals 613a and 613b, respectively. In this example, circuits 611, 612, and 614 are electrically decoupled from respective terminals 611a and 611b, 612a and 612b, and 614a and 614b. Thus, signal pairs OUT$_{f1}$'/OUT*$_{f1}$', OUT$_{f2}$'/OUT*$_{f2}$', and OUT$_{f4}$'/OUT*$_{f4}$' are not generated in this example.

In FIG. 6, capacitors C5 and C6 can be combined with (e.g., coupled to) inductor portions L1a' and L1b' to form part of oscillator 601$_1$, such as by forming an LC circuit (e.g., LC tank or resonance circuit) of oscillator 601$_1$. Capacitors C5 and C6 can be variable (e.g., tunable) capacitors, such that the capacitances of capacitors C5 and C6 can be selected (e.g., tuned) in order to select the value (e.g., a predetermined value) for frequency f1' of signal pair OUT$_{f1}$' and OUT*$_{f1}$'.

Capacitors C7 and C8 can be combined with (e.g., coupled to) inductor portions L2a' and L2b' to form an LC circuit (e.g., LC tank or resonance circuit) of oscillator 601$_2$. Capacitors C7 and C8 can be variable (e.g., tunable) capacitors, such that the capacitances of capacitors C7 and C8 can be selected (e.g., tuned) in order to select the value (e.g., a predetermined value) for frequency f2' of signal pair OUT$_{f2}$' and OUT*$_{f2}$'.

Capacitors C9 and C10 can be combined with (e.g., coupled to) inductor portions L3a' and L3b' to form an LC circuit (e.g., LC tank or resonance circuit) of oscillator 601$_3$. Capacitors C9 and C10 can be variable (e.g., tunable) capacitors, such that the capacitances of capacitors C9 and C10 can be selected (e.g., tuned) in order to select the value (e.g., a predetermined value) for frequency f3' of signal pair OUT$_{f3}$' and OUT*$_{f3}$'.

Capacitors C11 and C12 can be combined with (e.g., coupled to) inductor portions L4a' and L4b' to form an LC circuit (e.g., LC tank or resonance circuit) of oscillator 601$_4$. Capacitors C11 and C12 can be variable (e.g., tunable) capacitors, such that the capacitances of capacitors C11 and C12 can be selected (e.g., tuned) in order to select the value (e.g., a predetermined value) for frequency f4' of signal pair OUT$_{f4}$' and OUT*$_{f4}$'.

FIG. 6 shows two capacitors in each of circuitries 611c, 612c, 613c, and 614c as an example. However, each of circuitries 611c, 612c, 613c, and 614c can include fewer or more than two capacitors.

One skilled in the art would readily recognize that each of circuitries 611c, 612c, 613c, and 614c can also include transistors (not shown in FIG. 6) that can be coupled to respective inductor portions and respective capacitors to form part (e.g., an LC circuit) of a respective oscillator among oscillator $601_1$, oscillator $601_2$, oscillator $601_3$, and oscillator $601_4$.

FIG. 7A, FIG. 7B, FIG. 7C, and FIG. 7I) are timing diagrams for respective signal pairs $OUT_{f1}'/OUT*_{f1}'$, $OUT_{f2}'/OUT*_{f2}'$, $OUT_{f3}'/OUT*_{f3}'$, and $OUT_{f4}'/OUT*_{f4}'$ of FIG. 6, according to some embodiments described herein. Signal pairs $OUT_{f1}'/OUT*_{f1}'$, $OUT_{f2}'/OUT*_{f2}'$, $OUT_{f3}'/OUT*_{f3}'$, and $OUT_{f4}'/OUT*_{f4}'$ can be generated during respective time intervals Te-Tf (a time interval from time Te to time Tf), Tg-Th, Ti-Tj, and Tk-Il.

Time intervals Te-Tf, Tg-Th, Ti-Tj, and Tk-Tl can occur during the time intervals that modes 611m, 612m, 613m, and 614m are selected (by controller 602 in FIG. 6), respectively. Modes 611m, 612m, 613m, and 614m can be selected in any order (e.g., a non-sequential order (e.g., random order) or sequential order), depending on which of signal pairs $OUT_{f1}'/OUT*_{f1}'$, $OUT_{f2}'/OUT*_{f2}'$, $OUT_{f3}'/OUT*_{f3}'$, and $OUT_{f4}'/OUT*_{f4}'$ is selected to be used by IC device 600 during a particular time interval. Thus, time intervals Te-Tf, Tg-Th, Ti-Tj, and Tk-Tl can occur in any order, depending on which mode among modes 611m, 612m, 613m, and 614m is selected.

FIG. 8 shows a portion of IC device 600 including a structure (e.g., top view) of inductor L' and circuits 611, 612, 613, and 614 of FIG. 6, according to some embodiments described herein. As shown in FIG. 8, inductor L' can include a conductive path (e.g., formed from metal), which can include a path from terminal 614b continuously going through different segments (e.g., conductive segments) 845, 877, 844, 876, 843, 874, 842, 875, and 841 and then to terminal 614a. Segments 841, 874, 842, 875, 843, 876, 844, 877, and 845 are electrically in contact (electrically connected) with each other. Like segments 341, 374, 342, 375, and 343, and terminals 111a, 111b, 112a, and 112b, of inductor L in FIG. 3A, segments 841, 874, 842, 875, 843, 876, 844, 877, and 845, and terminals 611a, 611b, 612a, 612b, 613a, 613b, 614a, and 614b, of inductor L' can be located in different levels (e.g., similar to levels 380, 381, and 382 of FIG. 3B through FIG. 3F) of IC device 600. Each of segments 874, 875, 876, and 877 serves as a bridge that electrically connects respective segments of inductor L' to each other. Each of segments 874, 875, 876, and 877 can go over a portion of one of segments 841, 842, 843, 844, and 845 (as shown in FIG. 8).

The conductive path (e.g., formed by segments 841, 874, 842, 875, 843, 876, 844, 877, and 845) of inductor L' can have a spiral shape (e.g., a spiral coil), such that the conductive path of inductor L' can include multiple turns. FIG. 8 shows an example where inductor L' includes five turns (e.g., the five turns can be counted from terminal 614a going through segments 841, 874, 842, 875, 843, 876, 844, 877, and 845 and then coming back to terminal 614b). However, inductor L' can have a different number of turns.

The number of turns of inductor L' can be proportional to the number (e.g., four) of the oscillators that share inductor L'. Thus, in comparison with inductor L in FIG. 3A, inductor L' can have more turns than inductor L because the number (e.g., four) of the oscillators sharing inductor L' is greater than the number (e.g., two) of the oscillators that share inductor L.

Similar to terminals 111a, 111b, 112a, and 112b of inductor L (FIG. 3A), terminals 611a, 611b, 612a, 612b, 613a, 613b, 614a, and 614b in FIG. 8 can be coupled to (in electrical contact with) the conductive path of inductor L' at different locations (e.g., different tap points). Each of terminals 611a, 611b, 612a, 612b, 613a, and 613b can be coupled to a location (e.g., tap point) of the conductive path by a conductive material located inside a via (which can be similar to, or identical to, vias 331 and 332 (FIG. 3D)).

As shown in FIG. 8, inductor L' and circuits 611, 612, 613, and 614 can be located over a substrate (e.g., semiconductor substrate) 890 of IC device 600. Circuits 611, 612, 613, and 614 can be located on formed in or formed over) substrate 890. For simplicity, some of the physical circuit elements (e.g., transistors and capacitors) of circuits 611, 612, 613, and 614 are symbolically shown in FIG. 8.

Figure 9A:
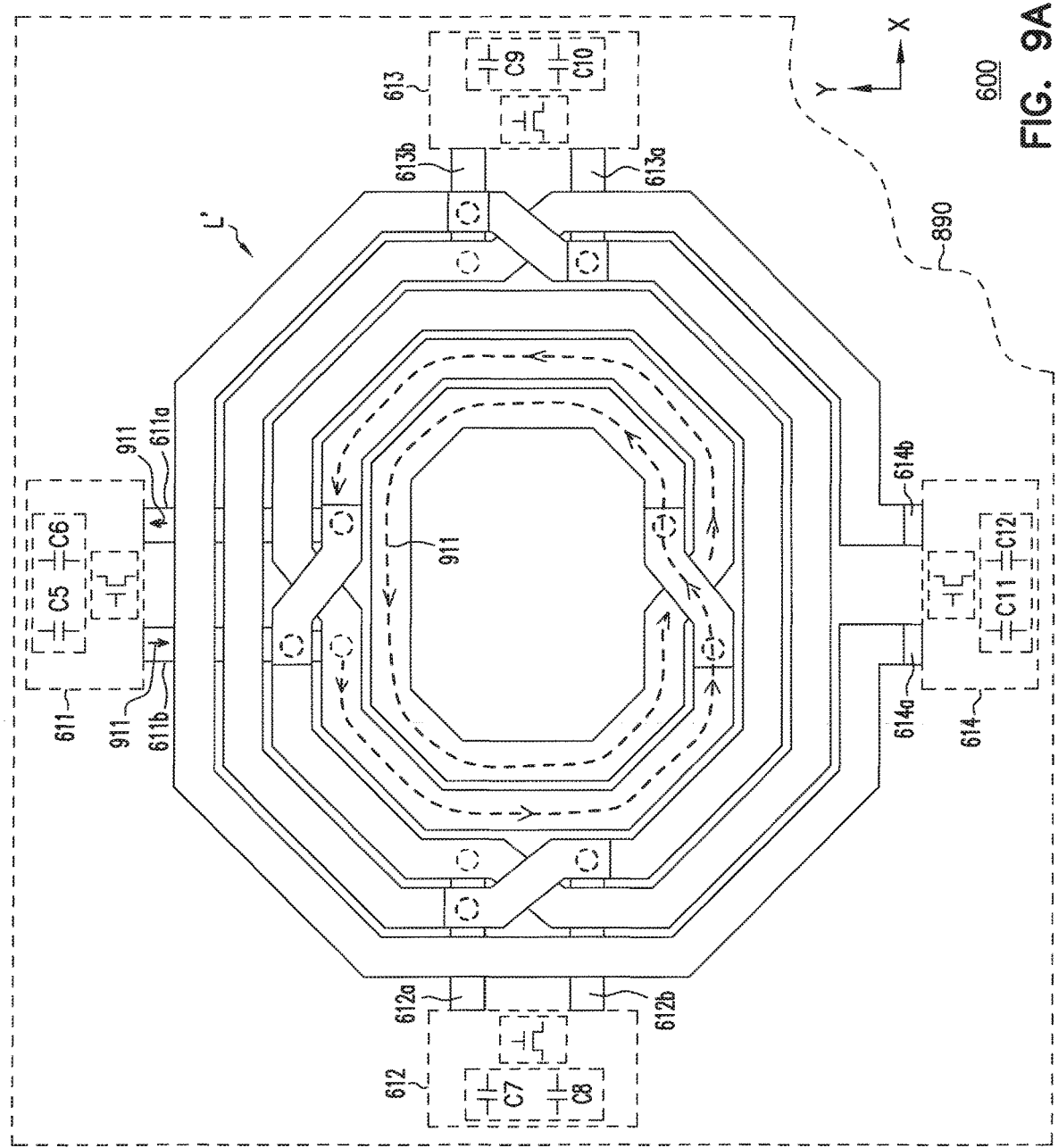
FIG. 9A shows a circuit path (e.g., current path) in the inductor of the IC device of FIG. 6 during an example operation of the IC device where a mode is selected, according to some embodiments described herein.
Figure 9B:
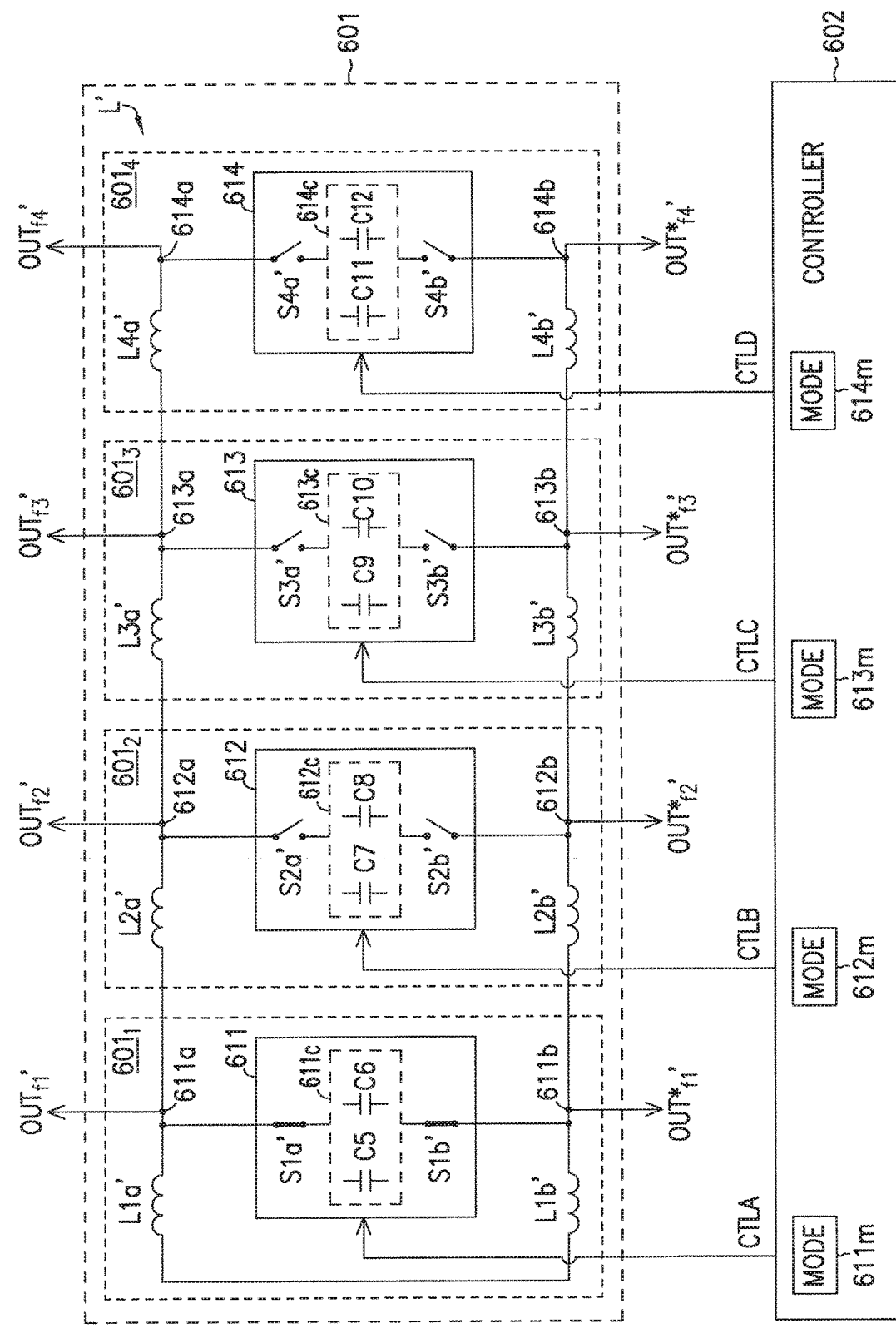
FIG. 9B shows the schematic diagram of FIG. 6 corresponding to the mode of the IC device of FIG. 9A being selected, according to some embodiments described herein.

FIG. 9A shows a circuit path (e.g., current path) 911 in inductor L' during an example operation of IC device 600 where mode 611m is selected (and modes 612m, 613m, and 614m (FIG. 6) are not selected), according to some embodiments described herein. FIG. 9B shows the schematic diagram of FIG. 6 where switches S1a' and S1b' are turned on (e.g., closed) and the other switches (e.g., switches S2a', S2b', S3a', S3b', S4a', and S4b') are turned off (e.g., open) in response to mode 611m being selected. Based on the schematic diagram of FIG. 9B, only inductor portions L1a' and L1b' of inductor L' are used (in combination with circuit 611) to generate signal pair $OUT_{f1}'/OUT*_{f1}'$. Inductor portions L2a', L2b', L3a', L3b', L4a', and L4b' of inductor L' are unused. Thus, circuit path 911 in FIG. 9A can include a portion (e.g., two turns (represented by inductor portions L1a' and L1b' in FIG. 9B)) of the total turns (e.g., five turns) of inductor L'. As shown in FIG. 9A, circuit path 911 can be formed between terminals 611a and 611b of oscillator $601_1$ in the segments that are represented by inductor portions L1a' and L1b' of FIG. 9B. In FIG. 9B, since switches S2a', S2b', S3a', S3b', S4a', and S4b' are turned off, signal pairs $OUT_{f2}'/OUT*_{f2}'$, $OUT_{f3}'/OUT*_{f3}'$, and $OUT_{f4}'/OUT*_{f4}'$ are not generated.

Figure 10A:
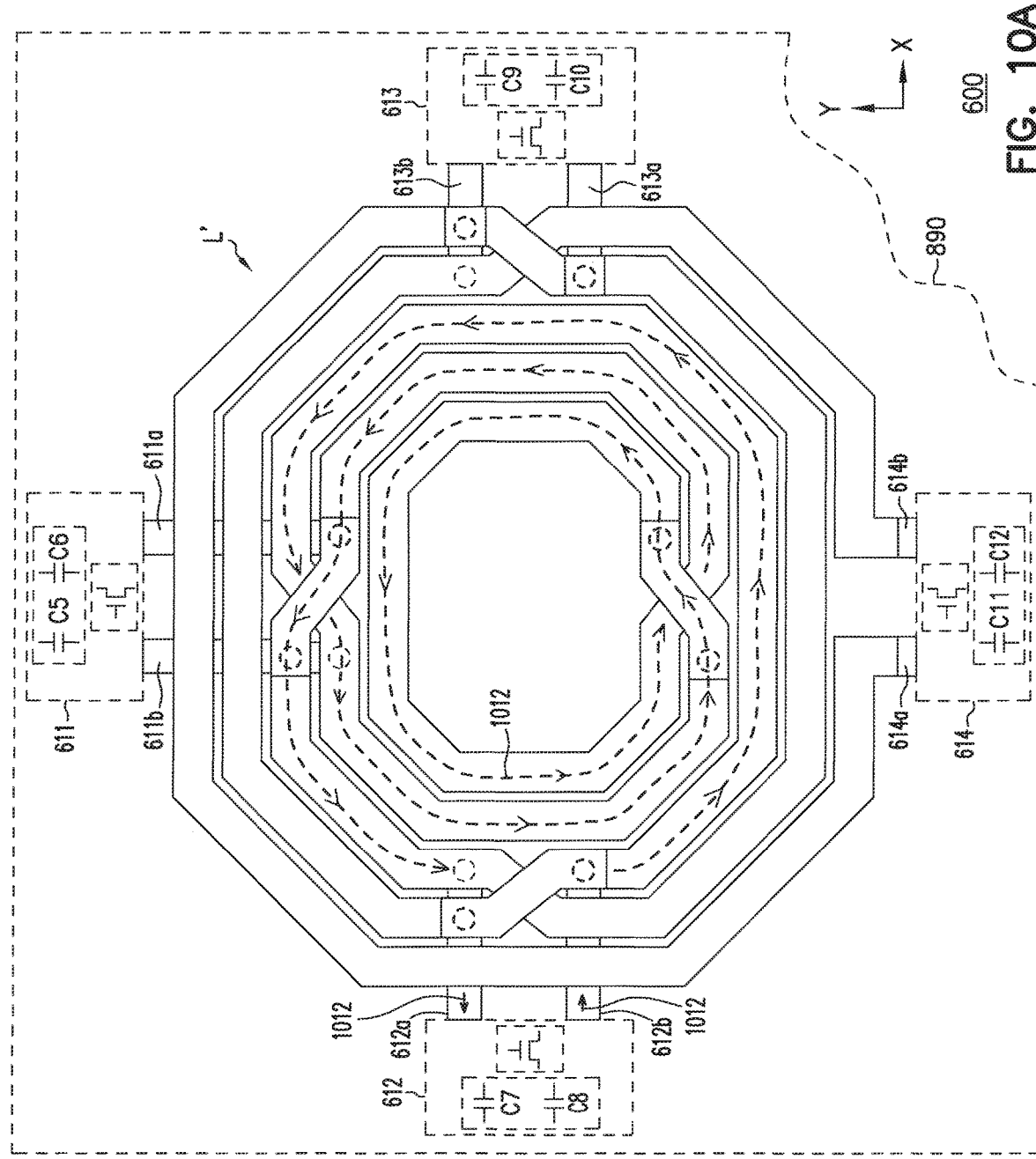
FIG. 10A shows a circuit path (e.g., current path) in the inductor of the IC device of FIG. 6 during an example operation of the IC device where another mode is selected, according to some embodiments described herein.
Figure 10B:
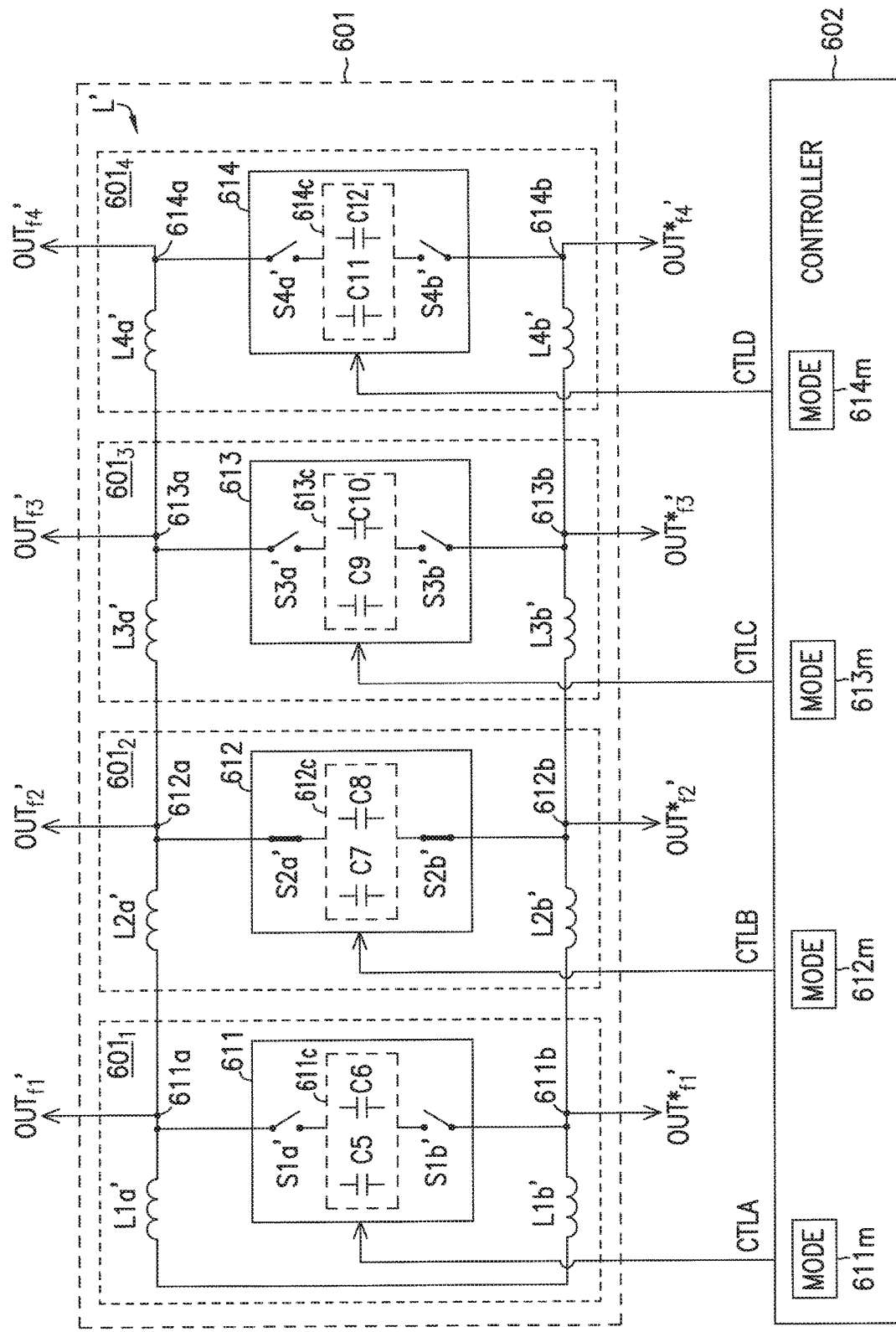
FIG. 10B shows the schematic diagram of FIG. 6 corresponding to the mode of the IC device of FIG. 10A being selected, according to some embodiments described herein.

FIG. 10A shows a circuit path (e.g., current path) 1012 in inductor L' during an example operation of IC device 600 where mode 612m is selected (and modes 611m, 613m, and 614m (FIG. 6) are not selected), according to some embodiments described herein. FIG. 10B shows the schematic diagram of FIG. 6 where switches S2a' and 52b' are turned on (e.g., closed) and the other switches (e.g., switches S1a', S1b', S3a', S3b', S4a', and S4b') are turned off (e.g., open) in response to mode 612m being selected. Based on the schematic diagram of FIG. 10B, only inductor portions L1a', L1b', L2a', and L2b' of inductor L' are used (in combination with circuit 612) to generate signal pair $OUT_{f2}'/OUT*_{f2}'$. Inductor portions L3a', L3b', L4a', and L4b' of inductor L' are unused. Thus, circuit path 1012 in FIG. 10A can include a portion (e.g., three turns (represented by inductor portions L1a', L1b', L2a', and L2b' in FIG. 10B)) of the total turns (e.g., five turns) of inductor L'. As shown in FIG. 10B, circuit path 1012 can be formed between terminals 612a and 612b of oscillator $601_2$ in the segments that are represented by inductor portions L1a', L1b', L2a', and L2b' of FIG. 10B. Signal pair $OUT_{f2}'/OUT*_{f2}'$ at respective terminals 612a and 612b is generated based on circuit path 1012. Thus, as shown in FIG. 10A, a circuit path is not formed between the terminals associated with oscillator $601_1$, oscillator $601_3$, and oscillator $601_4$. In FIG. 10B, since switches S1a', S1b', S3$a'$, S3$b'$, S4$a'$, and S4$b'$ are turned off, signal pairs OUT$_{f1}$'/OUT*$_{f1}$', OUT$_{f3}$'/OUT*$_{f3}$', and OUT$_{f4}$'/OUT*$_{f4}$' are not generated.

Figure 11A:
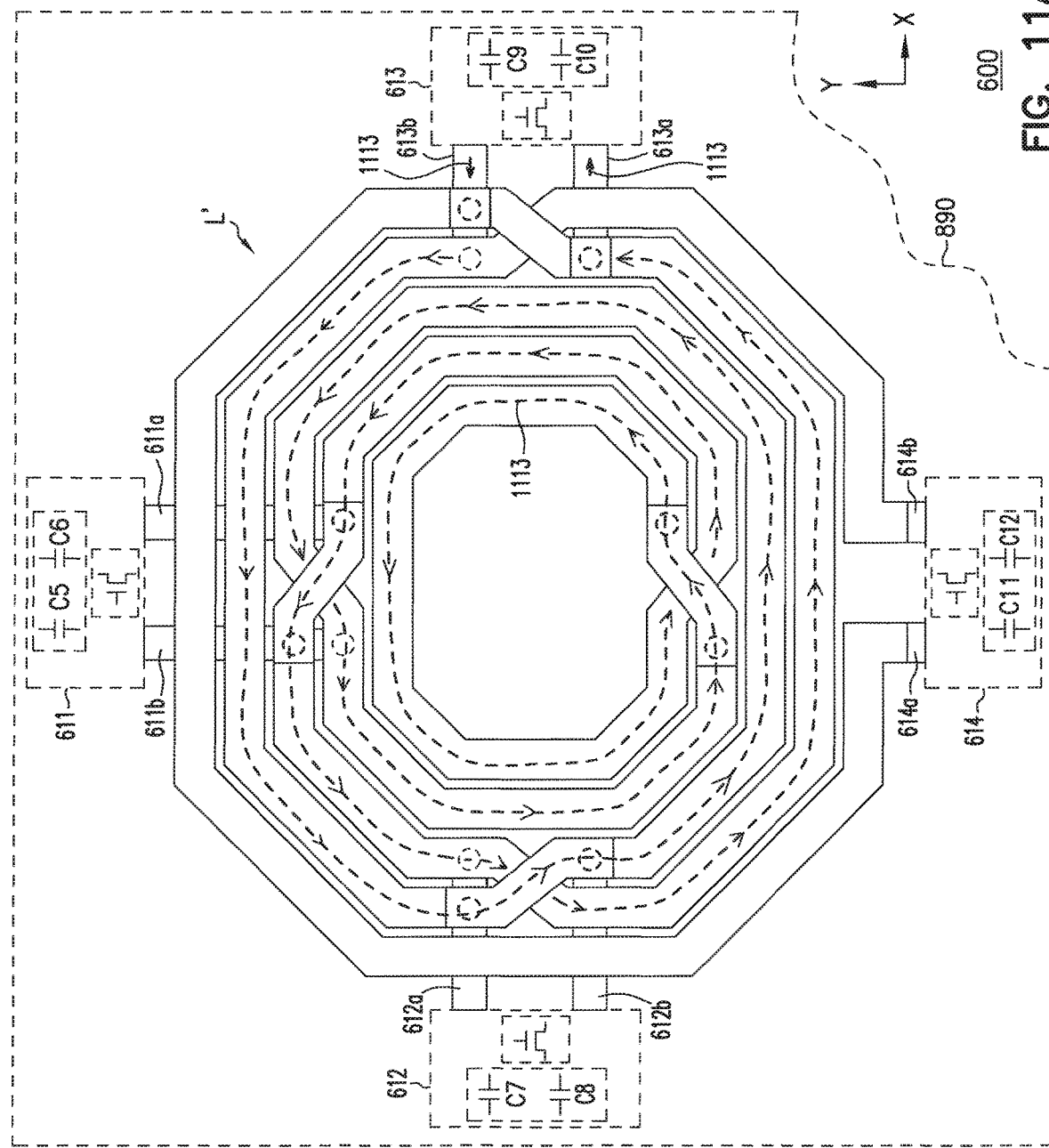
FIG. 11A shows a circuit path (e.g., current path) in the inductor of the IC device of FIG. 6 during an example operation of the IC device where another mode is selected, according to some embodiments described herein.
Figure 11B:
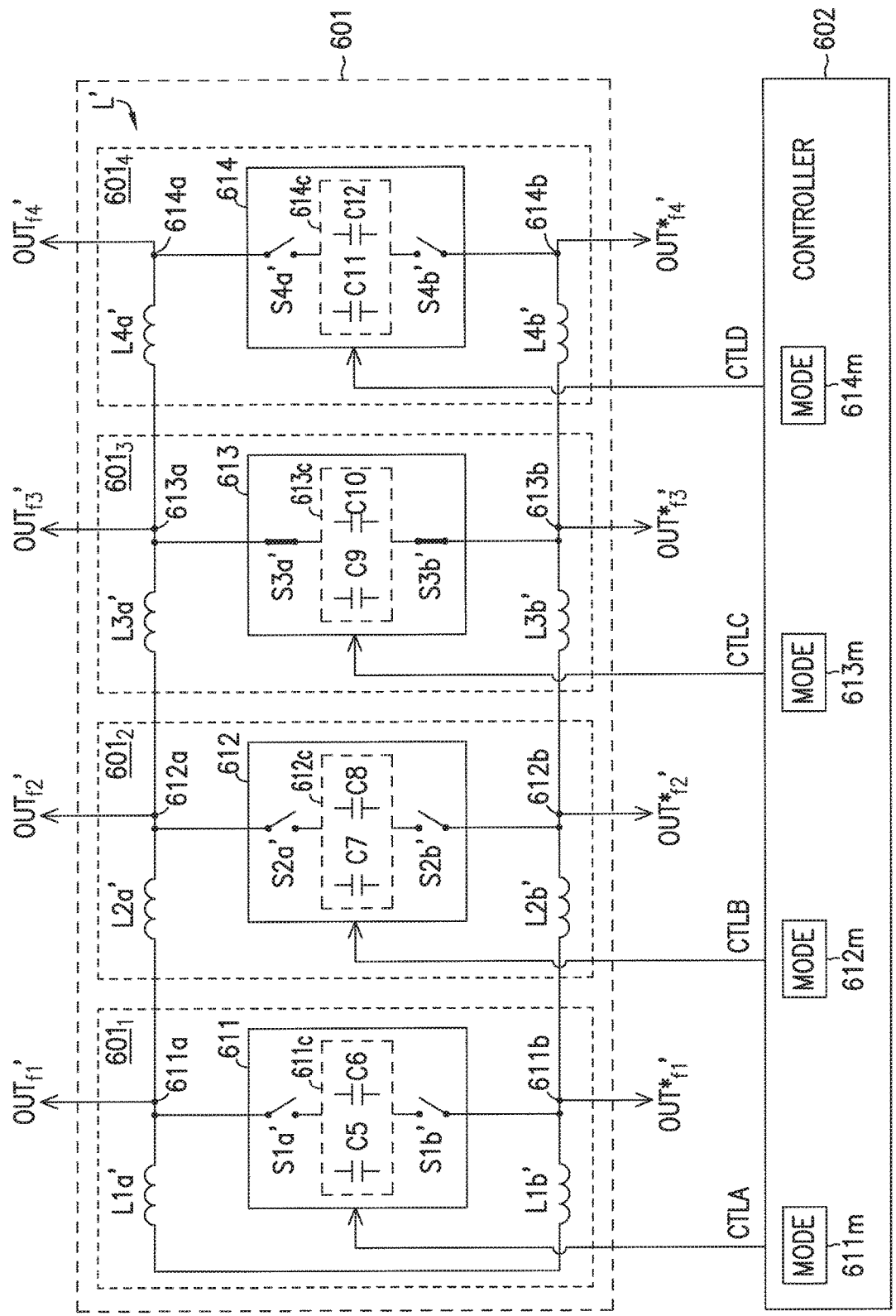
FIG. 11B shows the schematic diagram of FIG. 6 corresponding to the mode of the IC device of FIG. 11A being selected, according to some embodiments described herein.

FIG. 11A shows a circuit path (e.g., current path) 1113 in inductor L' during an example operation of IC device 600 where mode 613$m$ is selected (and modes 611$m$, 612$m$, and 614$m$ (FIG. 6) are not selected), according to some embodiments described herein. FIG. 11B shows the schematic diagram of FIG. 6 where switches S3$a'$ and S3$b'$ are turned on (e.g., closed) and the other switches (e.g., switches S1$a'$, S1$b'$, S2$a'$, S2$b'$, S4$a'$, and S4$b'$) are turned off (e.g., open) in response to mode 613$m$ being selected. Based on the schematic diagram of FIG. 11B, only inductor portions L1$a'$, L1$b'$, L2$a'$, L2$b'$, L3$a'$, and L3$b'$ of inductor L' are used (in combination with circuit 613) to generate signal pair OUT$_{f3}$'/OUT*$_{f3}$'. Inductor portions L4$a'$ and L4$b'$ of inductor L' are unused. Thus, circuit path 1113 in FIG. 11A can include a portion (e.g., four turns (represented by inductor portions L1$a'$, L1$b'$, L2$a'$, L2$b'$, L3$a'$, and L3$b'$ in FIG. 11B)) of the total turns (e.g., five turns) of inductor L'. As shown in FIG. 11A, circuit path 1113 can be formed between terminals 613$a$ and 613$b$ of oscillator 601$_3$ in the segments that are represented by inductor portions L1$a'$, L1$b'$, L2$a'$, L2$b'$, L3$a'$, and L3$b'$ of FIG. 11B. Signal pair OUT$_{f3}$'/OUT*$_{f3}$' at respective terminals 613$a$ and 613$b$ is generated based on circuit path 1113. In FIG. 11B, since switches S1$a'$, S1$b'$, S2$a'$, S2$b'$, S4$a'$, and S4$b'$ are turned off, signal pairs OUT$_{f1}$'/OUT*$_{f1}$', OUT$_{f2}$'/OUT*$_{f2}$', and OUT$_{f4}$'/OUT*$_{f4}$' are not generated.

Figure 12A:
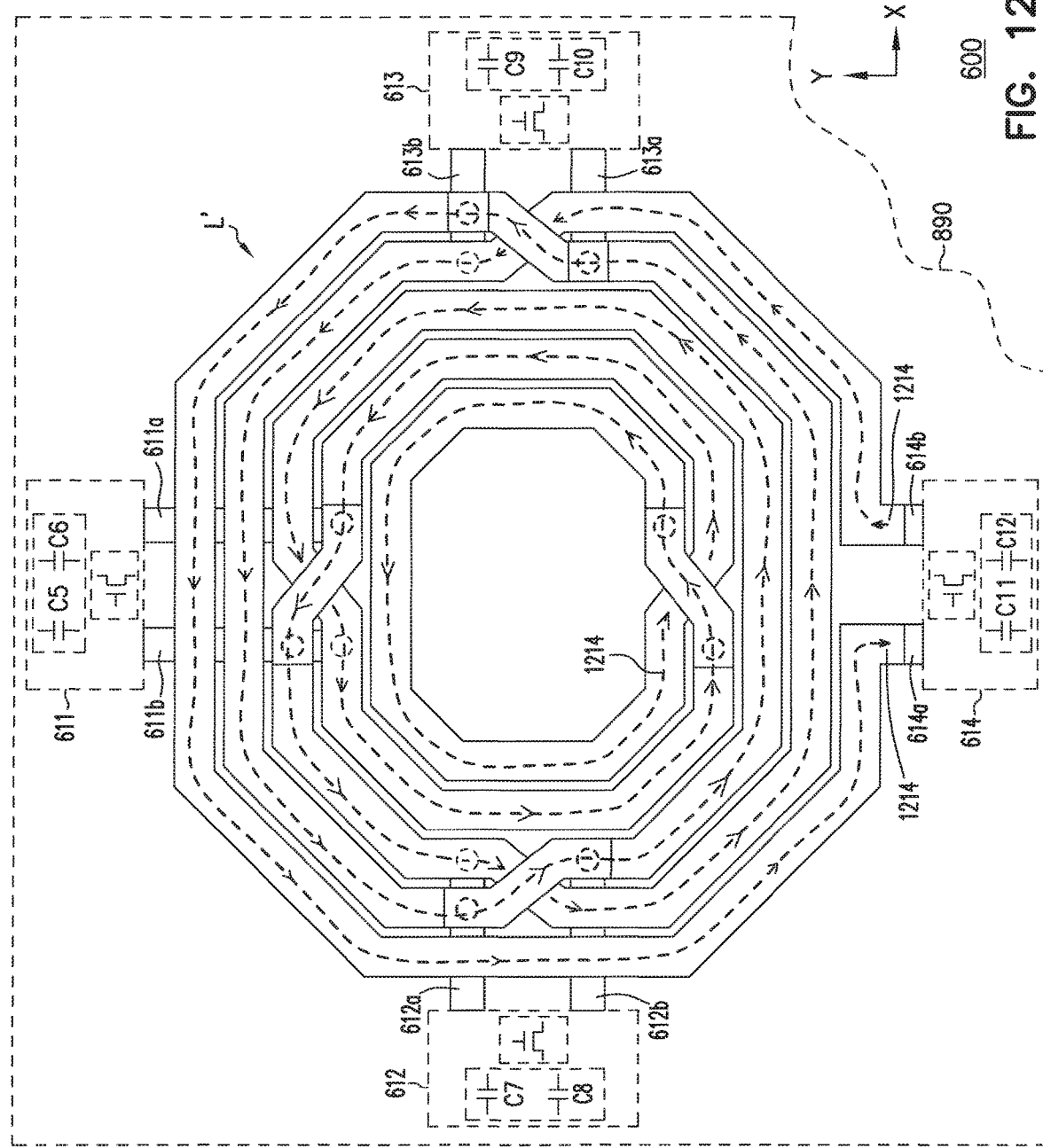
FIG. 12A shows a circuit path (e.g., current path) in the inductor of the IC device of FIG. 6 during an example operation of the IC device where another mode is selected, according to some embodiments described herein.
Figure 12B:
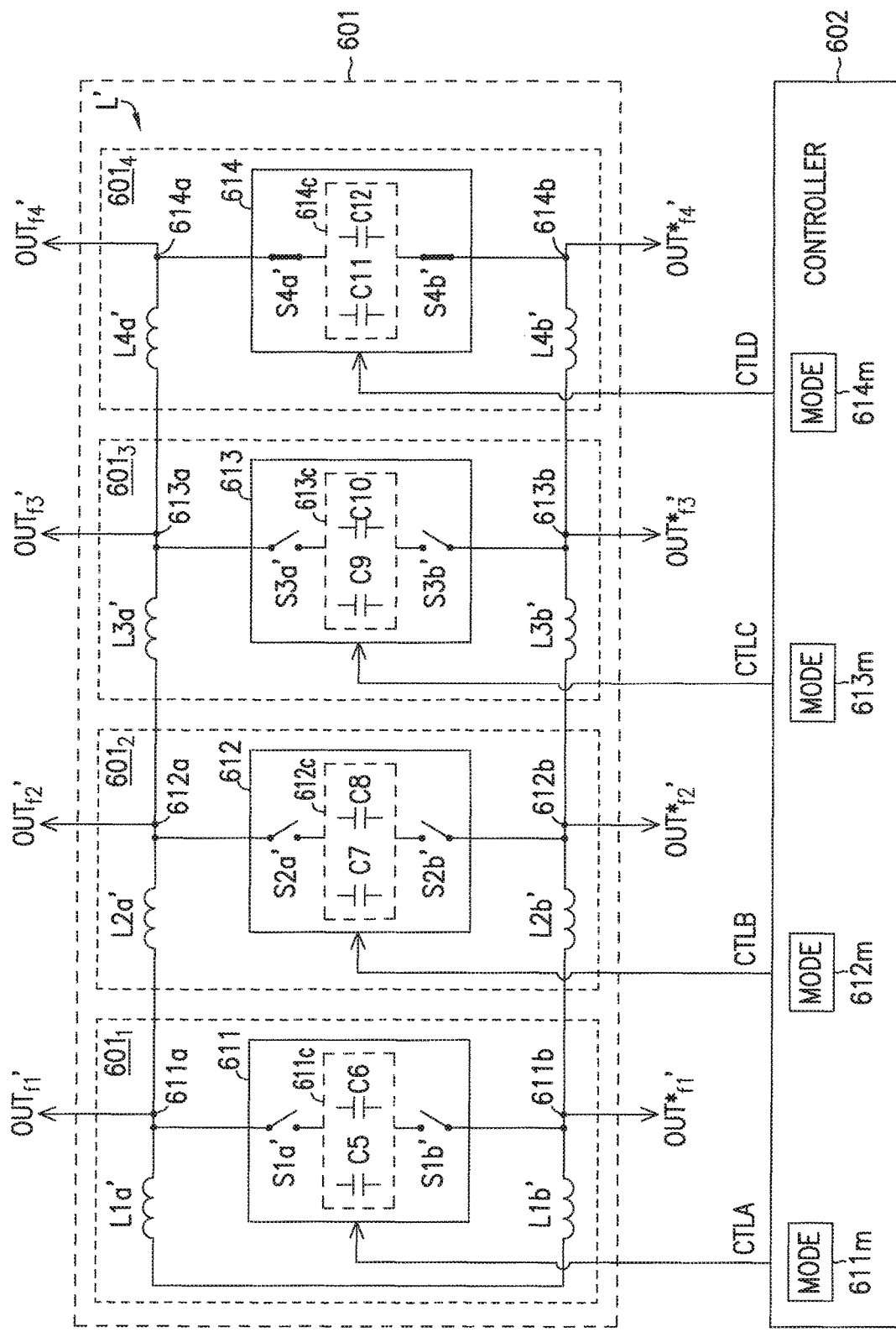
FIG. 12B shows the schematic diagram of FIG. 6 corresponding to the mode of the IC device of FIG. 12A being selected, according to some embodiments described herein.

FIG. 12A shows a circuit path (e.g., current path) 1214 in inductor L' during an example operation of IC device 600 where mode 614$m$ is selected (and modes 611$m$, 612$m$, and 613$m$ (FIG. 6) are not selected), according to some embodiments described herein. FIG. 12B shows the schematic diagram of FIG. 6 where switches S4$a'$ and S4$b'$ are turned on (e.g., closed) and the other switches (e.g., switches S1$a'$, S1$b'$, S2$a'$, S2$b'$, S3$a'$, and S3$b'$) are turned off (e.g., open) in response to mode 614$m$ being selected. Based on the schematic diagram of FIG. 12B, all of inductor portions L1$a'$, L1$b'$, L2$a'$, L2$b'$, L3$a'$, L3$b'$, L4$a'$, and L4$b'$ of inductor L' are used (in combination with circuit 614) to generate signal pair OUT$_{f4}$'/OUT*$_{f4}$'. Thus, circuit path 1214 in FIG. 12A can include all of the turns (represented by inductor portions L1$a'$, L1$b'$, L2$a'$, L2$b'$, L3$a'$, L3$b'$, L4$a'$, and L4$b'$ in FIG. 12B) of the total turns (e.g., five turns) of inductor L'. As shown in FIG. 12A, circuit path 1214 can be formed between terminals 614$a$ and 614$b$ of oscillator 601$_4$ in the segments that are represented by inductor portions L1$a'$, L1$b'$, L2$a'$, L2$b'$, L3$a'$, L3$b'$, L4$a'$, and L4$b'$ of FIG. 12B. Signal pair OUT$_{f4}$'/OUT*$_{f4}$' at respective terminals 614$a$ and 614$b$ is generated based on circuit path 1214. In FIG. 12B, since switches S1$a'$, S1$b'$, S2$a'$, S2$b'$, S3$a'$, and S3$b'$ are turned off, signal pairs OUT$_{f1}$'/OUT*$_{f1}$', OUT$_{f2}$'/OUT*$_{f2}$', and OUT$_{f3}$'/OUT*$_{f3}$' are not generated.

The inclusion of oscillator circuitry 601 in IC device 600 allows IC device 600 to have improvements and benefits similar to those of IC device 100 (FIG. 1 through FIG. 5B).

Figure 13:
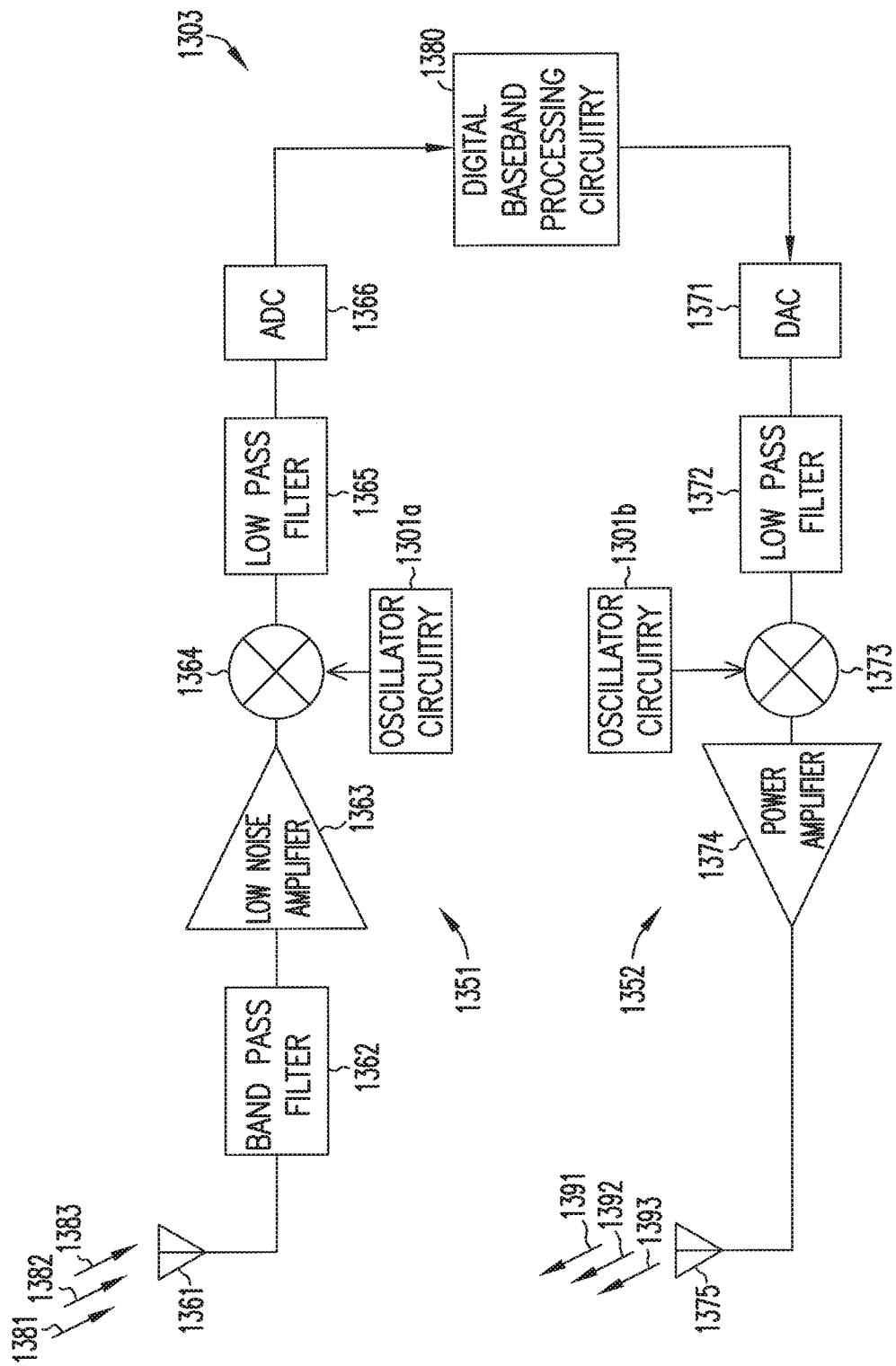
FIG. 13 shows a schematic diagram of an apparatus in the form of an IC device including a transceiver and oscillator circuitry, according to some embodiments described herein.

FIG. 13 shows a schematic diagram of an apparatus in the form of an IC device 1300 including a transceiver 1303 that includes oscillator circuitry 1301$a$ and oscillator circuitry 1301$b$, according to some embodiments described herein. The apparatus of FIG. 13 (which includes IC device 1300) can have a capability of communicating wirelessly. Examples of such an apparatus include a mobile device (e.g., a cellular phone, a smart phone, or other portable phones), a computer (e.g., a laptop, a notebook, or a desktop), a digital television, a Wi-Fi communication station (STA) such as a wireless access point (AP), a base station, or other wireless communication devices or systems.

The apparatus of FIG. 13 can be configured to receive and transmit orthogonal frequency division multiplexed (OFDM) or orthogonal frequency division multiple access (OFDMA) communication signals over a multicarrier communication channel. The OFDM or OFDMA signals may include a plurality of orthogonal subcarriers.

The apparatus of FIG. 13 can be configured to transmit and receive signals in accordance with specific communication standards and/or protocols, such as any of the Institute of Electrical and Electronics Engineers (IEEE) standards including 802.11n-2009, 802.11-2012, 802.11ac, and/or 802.11ax standards and/or proposed specifications for WLANs, and other techniques and standards.

The apparatus of FIG. 13 can be configured for high-efficiency (HE) Wi-Fi (HEW) communications in accordance with the IEEE 802.11ax standard. In this configuration, the apparatus of FIG. 13 can be configured to communicate in accordance with an OFDMA technique.

The apparatus of FIG. 13 can be configured to transmit and receive signals using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, and other modulation techniques.

The apparatus of FIG. 13 can be configured to transmit and receive signals in accordance with cellular communication standards (e.g., Third-Generation Partnership Project (3GPP), such as Long Term Evolution (LIE), LTE-Advanced, or 5G communications).

In FIG. 13, transceiver 1303 can operate to allow IC device 1300 to wirelessly communicate with another device (e.g., another wireless communication device, not shown in FIG. 13). For example, as shown in FIG. 13, transceiver 1303 can include a receiving path 1351 and a transmitting path 1352. Receiving path 1351 can operate to receive information (e.g., in the form of signals (e.g., radio waves)) transmitted to IC device 1300 from another device. Transmitting path 1352 can operate to transmit information (e.g., in the form of signals (e.g., radio waves)) from IC device 1300 to another device.

As shown in FIG. 13, receiving path 1351 can include at least one antenna circuit 1361, a filter (e.g., bandpass filter) 1362, an amplifier (e.g., a low noise amplifier) 1363, a mixer (e.g., down-mixer (or down-converter)) 1364, a filter (e.g., low pass filter) 1365, and an analog-to-digital convert (ADC) 1366. Receiving path 1351 can include oscillator circuitry 1301$a$ that can provide signals (input signals) to input nodes of mixer 1364.

Transmitting path 1352 can include a digital-to-analog converter (DAC) 1371, a filter (e.g., low pass filter) 1372, a mixer (e.g., up-mixer (or up-converter)) 1373, an amplifier (e.g., a power amplifier) 1374, and at least one antenna circuit 1375. Transmitting path 1352 can include oscillator circuitry 1301$b$ that can provide signals (input signals) to input nodes of mixer 1373.

Transceiver 1303 can include a digital baseband processing circuitry 1380. Digital baseband processing circuitry 1380 can receive information from receiving path 1351 for further processing. Digital baseband processing circuitry 1380 can provide information to transmitting path 1352 to be transmitted to another device. Digital baseband processing circuitry 1380 can be configured to process WLAN baseband signaling, BT baseband signaling, or both WLAN and BT baseband signaling.

Each of antenna circuit 1361 and antenna circuit 1375 can include or can be part of a plurality of antennas to wirelessly communicate using at least one of single-input multiple-output (SIMO), multiple-input multiple-output (MIMO), or multiple-input single-output (MISO) techniques.

In FIG. 13, antenna circuit 1361 can operate to wirelessly receive signals (e.g., receive signals) 1381, 1382, and 1383 having different frequencies, such as frequencies f1", f2", and f3", respectively. For simplicity, FIG. 13 shows a single antenna symbol to represent antenna circuit 1361. However, antenna circuit 1361 can include a single antenna (physical antenna) or multiple antennas (multiple physical antennas). Antenna circuit 1361 can include a single antenna to receive signals 1381, 1382, and 1383, such that signals 1381, 1382, and 1383 can be received by the same antenna. Alternatively, antenna circuit 1361 can include multiple antennas (different antennas) to receive signals 1381, 1382, and 1383, such that signals 1381, 1382, and 1383 can be received by different antennas. FIG. 13 shows an example where antenna circuit 1361 can operate to receive three signals having three frequencies. However, antenna circuit 1361 can be configured to receive fewer or more than three signals having different frequencies.

Antenna circuit 1375 can operate to transmit signals (e.g., transmit signals) 1391, 1392, and 1393 having different frequencies, such as frequencies f1", f2", and f3", respectively. For simplicity, FIG. 13 shows a single antenna symbol to represent antenna circuit 1375. However, antenna circuit 1375 can include a single antenna (physical antenna) or multiple antennas (multiple physical antennas). For example, antenna circuit 1375 can include a single antenna to transmit signals 1391, 1392, and 1393, such that signals 1391, 1392, and 1393 can be transmitted by the same antenna. In another example, antenna circuit 1375 can include multiple antennas (different antennas) to transmit signals 1391, 1392, and 1393, such that signals 1391, 1392, and 1393 can be transmitted by different antennas. FIG. 13 shows an example where antenna circuit 1375 can operate to transmit three signals having three frequencies. However, antenna circuit 1375 can be configured to transmit fewer or more than three signals having different frequencies.

The operations of transceiver 1303 can be similar to the operations of a wireless communication device and can be readily understood by one skilled in the art. Thus, detailed operation of transceiver 1303 is omitted from the description of FIG. 13, in FIG. 13, oscillator circuitry 1301a can include any of oscillator circuitry 101 (FIG. 1 through FIG. 5B) and oscillator circuitry 601 (FIG. 6 through FIG. 12B). Thus, oscillator circuitry 1301a can include multiple oscillators (e.g., local oscillators) to generate different frequencies at different time intervals, depending on which signal among signals 1381, 1382, and 1383 receiving path 1351 receives during a particular time interval.

For example, if receiving path 1351 operates to receive signal 1381 (having frequency f1") at antenna circuit 1361 during a particular time interval, then oscillator circuitry 1301a can operate to generate a signal (or a differential signal pair) having a frequency (e.g., frequency f1) based on frequency f1" of signal 1381 during that particular time interval. In another example, if receiving path 1351 operates to receive signal 1382 (having frequency f2") at antenna circuit 1361 during a particular time interval, then oscillator circuitry 1301a can operate to generate a signal (or a differential signal pair) having a frequency (e.g., frequency f2) based on frequency f2" of signal 1382 during that particular time interval. In a further example, if receiving path 1351 operates to receive signal 1383 (having frequency f3") at antenna circuit 1361 during a particular time interval, then oscillator circuitry 1301a can operate to generate a signal (or a differential signal pair) having a frequency (e.g., frequency f3) based on frequency f3" of signal 1383 during that particular time interval.

In FIG. 13, oscillator circuitry 1301b can include any of oscillator circuitry 101 (FIG. 1 through FIG. 5B) and oscillator circuitry 601 (FIG. 6 through FIG. 12B). Thus, oscillator circuitry 1301b can include multiple oscillators (e.g., local oscillators) generate different frequencies at different time intervals, depending on which signal among signals 1391, 1392, and 1393 transmitting path 1352 transmits during a particular time interval.

For example, if transmitting path 1352 operates to transmit signal 1391 (having frequency f1") at antenna circuit 1375 during a particular time interval, then oscillator circuitry 1301b can operate to generate a signal (or a differential signal pair) having a frequency (e.g., frequency f1) based on frequency f1" of signal 1391 during that particular time interval. In another example, if transmitting path 1352 operates to transmit signal 1392 (having frequency f2") at antenna circuit 1375 during a particular time interval, then oscillator circuitry 1301b can operate to generate a signal (or a differential signal pair) having a frequency (e.g., frequency f2) based on frequency f2" of signal 1392 during that particular time interval. In a further example, if transmitting path 1352 operates to transmit signal 1393 (having frequency f3") at antenna circuit 1375 during a particular time interval, then oscillator circuitry 1301b can operate to generate a signal (or a differential signal pair) having a frequency (e.g., frequency f3) based on frequency f3" of signal 1393 during that particular time interval.

The inclusion of oscillator circuitries 1301a and 1301b in IC device 1300 allows IC device 1300 to have improvements and benefits similar to those of IC device 100 (FIG. 1 through FIG. 5B) and IC device 600 (FIG. 6 through FIG. 12B).

FIG. 14 is a flowchart showing a method 1400 of operating an apparatus including an IC device, according to some embodiments described herein. The apparatus including an IC device used in method 1400 can include any of the apparatuses and IC devices described above with reference to FIG. 1 through FIG. 13. Some of the activities in method 1400 may be performed by hardware, software, firmware, or any combination of hardware, software, and firmware. Such hardware, software, and firmware can be included in the device or system that includes the device.

As shown in FIG. 14, activity 1410 of method 1400 can include turning on at least one first switch during a first time interval to electrically couple a first circuit of a first oscillator to a conductive path of an inductor formed in an integrated circuit device and to generate a first signal at a first terminal of the first oscillator. Activity 1420 can include turning off at least one second switch during the first time interval to electrically decouple a second circuit of a second oscillator from the conductive path of the inductor. Activity 1430 can include turning off the at least one first switch during a second time interval to electrically decouple the first circuit of the first oscillator from the conductive path of the inductor. Activity 1440 can include turning on the at least one second switch during the second time interval to electrically couple the second circuit of the second oscillator to the conductive path of the inductor and to generate a second signal at a second terminal of the second oscillator. The first and second signals can have different frequencies.

Method 1400 can include fewer or more activities relative to activities 1410, 1420, 1430, and 1440 shown in FIG. 14. For example, method 1400 can include activities and operations of any of the apparatuses and IC devices described above with reference to FIG. 1 through FIG. 13.

The illustrations of the apparatuses (e.g., the apparatuses including IC devices 100, 600, and 1300 and oscillator circuitries 101, 601, 1301a, and 1301b) and methods (e.g., method 1400 and operations of the apparatuses including IC devices 100, 600, and 1300 and oscillator circuitries 101, 601, 1301a, and 1301b) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

Additional Notes and Examples

Example 1 includes subject matter (such as a device, an electronic apparatus (e.g., circuit, electronic system, or both), or a machine) including an inductor including a conductive path formed in an integrated circuit device, a first oscillator of the integrated circuit device, the first oscillator including a first terminal coupled to the conductive path of the inductor to provide a first signal, the first signal having a first frequency, and a second oscillator included in the integrated circuit device, the second oscillator including a second terminal coupled to the conductive path of the inductor to provide a second signal, the second signal having a second frequency different from the first frequency.

In Example 2, the subject matter of Example 1 may optionally include, wherein the first oscillator includes at least one capacitor to combine with a first portion of the conductive path of the inductor and form part of a first inductor-capacitor (LC) oscillator, and the second oscillator includes at least one capacitor to combine with a second portion of the conductive path of the inductor and form part of a second LC oscillator.

In Example 3, the subject matter of Example 2 may optionally include, wherein the conductive path includes multiple turns, and the first portion of the conductive path of the inductor includes a first portion of the multiple turns, and the second portion of the conductive path of the inductor includes a second portion of the multiple turns, and the first portion of the multiple turns and the second portion of the multiple turns include different numbers of turns.

In Example 4, the subject matter of Example 1 may optionally include, wherein the first circuit includes a first additional terminal coupled to the conductive path to provide a first additional signal, wherein the first signal and the first additional signal form a first differential signal pair, and the second circuit includes a second additional terminal coupled to the conductive path to provide a second additional signal, wherein the second signal and the second additional signal form a second differential signal pair.

In Example 5, the subject matter of any of Example 1 may optionally include, wherein a third circuit included in the integrated circuit device, the third circuit including a third terminal coupled to the conductive path to provide a third signal, the third signal having a third frequency, wherein the third frequency is different from each of the first and second frequencies.

In Example 6, the subject matter of any of Example 5 may optionally include, wherein the first circuit includes a first additional terminal coupled to the conductive path to provide a first additional signal, wherein the first signal and the first additional signal form a first differential signal pair, the second circuit includes a second additional terminal coupled to the conductive path to provide a second additional signal, wherein the second signal and the second additional signal form a second differential signal pair, and the third circuit includes a third additional terminal coupled to the conductive path to provide a third additional signal, wherein the third signal and the third additional signal form a third differential signal pair.

Example 7 includes subject matter (such as a device, an electronic apparatus (e.g., circuit, electronic system, or both), or a machine) including an inductor including a conductive path formed in an integrated circuit device, the conductive path including multiple turns, a first segment, a second segment, and a third segment of the conductive path formed in a first level of the integrated circuit device, a fourth segment of the conductive path formed in a second level of the integrated circuit device, the fourth segment electrically coupling the first segment to the second segment, and a fifth segment of the conductive path formed in a level of the integrated circuit device different from the first level, the fifth segment electrically coupling the second segment to the third segment.

In Example 8, the subject matter of Example 7 may optionally include, wherein a first via between the first and second levels, a second via between the first and second levels, a first conductive material in the first via, the first conductive material electrically in contact with the first and fourth segments, and a second conductive material in the second via, the second conductive material electrically in contact with the second and fourth segments.

In Example 9, the subject matter of Example 8 may optionally include, wherein a third via between the first and second levels, a fourth via between the first and second levels, a third conductive material in the third via, the third conductive material electrically in contact with the second and fifth segments, and a fourth conductive material in the fourth via, the fourth conductive material electrically in contact with the third and fifth segments.

In Example 10, the subject matter of Example 7 may optionally include, wherein a first terminal in electrical contact with a first location of the conductive path, a first additional terminal in electrical contact with a first additional location of the conductive path, a second terminal in electrical contact with a second location of the conductive path, and a second additional terminal in electrical contact with a second additional location of the conductive path.

In Example 11, the subject matter of Example 10 may optionally include, wherein a first capacitor, and a first switch coupled between the first capacitor and the first terminal, and a second capacitor, and a second switch coupled between the second capacitor and the second terminal.

In Example 12, the subject matter of Example 7 may optionally include, wherein part of the third segment is between part of the fourth segment and a substrate of the integrated circuit device.

In Example 13, the subject matter of any of Example 12 optionally include, wherein part of the second segment is between part of the fifth segment and the substrate.

Example 14, the subject matter of Example 7 may optionally include, wherein the conductive path includes a sixth segment formed in the first level, and the conductive path includes a seventh segment formed in a level of the integrated circuit device different from the first level, and the seventh segment electrically couples the third segment to the sixth segment.

In Example 15, the subject matter of Example 14 may optionally include, wherein the conductive path includes an eighth segment formed in the first level, and the conductive path includes a ninth segment formed in a level of the integrated circuit device different from the first level, and the ninth segment electrically couples the sixth segment to the eighth segment.

Example 16 includes subject matter (such as a device, an electronic apparatus (e.g., circuit, electronic system, or both), or a machine) including an antenna, and a circuit path included in an integrated circuit device and coupled to the antenna, the circuit path including a mixer and oscillator circuitry coupled to the mixer, the oscillator circuitry including an inductor including a conductive path, a first oscillator including a first terminal coupled to the conductive path of the inductor to provide a first signal, the first signal having a first frequency, and a second oscillator including a second terminal coupled to the conductive path of the inductor to provide a second signal, the second signal having a second frequency different from the first frequency.

In Example 17, the subject matter of Example 16 may optionally include, wherein the circuit path is a receiving path of the integrated circuit device.

In Example 18, the subject matter of Example 16 may optionally include, wherein the circuit path is a transmitting path of the integrated circuit device.

In Example 19, the subject matter of Example 16 may optionally include, wherein the antenna is to receive a first receive signal during a first time interval, and the first frequency of the first signal generated from the first oscillator is based on a frequency of the first receive signal.

In Example 20, the subject matter of any of Example 19 may optionally include, wherein the antenna is to receive a second receive signal during a second time interval, and the second frequency of the second signal generated from the second oscillator is based on a frequency of the second receive signal.

In Example 21, the subject matter of any of Example 16 may optionally include, wherein the antenna is to transmit a first transmit signal during the first time interval, and the first frequency of the first signal generated from the first oscillator is based on a frequency of the first transmit signal.

In Example 22, the subject matter of any of Example 21 may optionally include, wherein the antenna is to transmit a second transmit signal during the second time interval, and the second frequency of the second signal generated from the second oscillator is based on a frequency of the second transmit signal.

Example 23 includes subject matter (such as a method of operating a device, an electronic apparatus (e.g., circuit, electronic system, or both), or a machine) including turning on at least one first switch during a first time interval to electrically couple a first circuit of a first oscillator to a conductive path of an inductor formed in an integrated circuit device and to generate a first signal at a first terminal of the first oscillator, turning off at least one second switch during the first time interval to electrically decouple a second circuit of a second oscillator from the conductive path of the inductor, turning off the at least one first switch during a second time interval to electrically decouple the first circuit of the first oscillator from the conductive path of the inductor, and turning on the at least one second switch during the second time interval to electrically couple the second circuit of the second oscillator to the conductive path of the inductor and to generate a second signal at a second terminal of the second oscillator, wherein the first and second signals have different frequencies.

In Example 24, the subject matter of Example 23 may optionally include, wherein receiving a first receive signal at an antenna circuit during the first time interval, wherein a frequency of the first signal is based on a frequency of the first receive signal, and receiving a second receive signal at the antenna circuit during the second time interval, wherein a frequency of the second signal is based on a frequency of the second receive signal.

In Example 25, the subject matter of Example 24 may optionally include, wherein the first and second receive signals are received at different antennas of the antenna circuit.

In Example 26, the subject matter of Example 24 may optionally include, wherein the first and second receive signals are received at a same antenna of the antenna circuit.

In Example 27, the subject matter of Example 23 may optionally include, wherein transmitting a first transmit signal at an antenna circuit during the first time interval, wherein a frequency of the first signal is based on a frequency of the first transmit signal, and transmitting a second transmit signal at the antenna circuit during the second time interval, wherein a frequency of the second signal is based on a frequency of the second transmit signal.

In Example 28, the subject matter of Example 27 may optionally include, wherein the first and second transmit signals are transmitted from different antennas of the antenna circuit.

In Example 29, the subject matter of Example 27 may optionally include, wherein the first and second transmit signals are transmitted from a same antenna of the antenna circuit.

Example 30 includes an electronic apparatus comprising means for performing any of the methods of Examples 23-29.

The above description and the drawings illustrate some embodiments to enable those skilled in the art to practice the embodiments of the subject matter described herein. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
an inductor including a conductive path formed in an integrated circuit device, the conductive path including a first segment, a second segment, and a third segment formed in a first level of the integrated circuit device, a fourth segment formed in a second level of the integrated circuit device, the fourth segment electrically coupling the first segment to the second segment, and a fifth segment formed in a level of the integrated circuit device different from the first level; the fifth segment electrically coupling the second segment to the third segment;
a first oscillator of the integrated circuit device, the first oscillator including a first terminal coupled to the conductive path of the inductor to provide a first signal, the first signal having a first frequency; and
a second oscillator included in the integrated circuit device, the second oscillator including a second terminal coupled to the conductive path of the inductor to provide a second signal, the second signal having a second frequency different from the first frequency.

2. The apparatus of claim 1, wherein:
the first oscillator includes at least one capacitor to combine with a first portion of the conductive path of the inductor and form part of a first inductor-capacitor (LC) oscillator; and
the second oscillator includes at least one capacitor to combine with a second portion of the conductive path of the inductor and form part of a second LC oscillator.

3. The apparatus of claim 2, wherein the conductive path includes multiple turns, and:
the first portion of the conductive path of the inductor includes a first portion of the multiple turns; and
the second portion of the conductive path of the inductor includes a second portion of the multiple turns, and the first portion of the multiple turns and the second portion of the multiple turns include different numbers of turns.

4. The apparatus of claim 1, wherein:
the first circuit includes a first additional terminal coupled to the conductive path to provide a first additional signal, wherein the first signal and the first additional signal form a first differential signal pair; and
the second circuit includes a second additional terminal coupled to the conductive path to provide a second additional signal, wherein the second signal and the second additional signal form a second differential signal pair.

5. The apparatus of claim 1, further comprising:
a third circuit included in the integrated circuit device, the third circuit including a third terminal coupled to the conductive path to provide a third signal, the third signal having a third frequency, wherein the third frequency is different from each of the first and second frequencies.

6. The apparatus of claim 5, wherein:
the first circuit includes a first additional terminal coupled to the conductive path to provide a first additional signal, wherein the first signal and the first additional signal form a first differential signal pair;
the second circuit includes a second additional terminal coupled to the conductive path to provide a second additional signal, wherein the second signal and the second additional signal form a second differential signal pair; and
the third circuit includes a third additional terminal coupled to the conductive path to provide a third additional signal, wherein the third signal and the third additional signal form a third differential signal pair.

7. An apparatus comprising:
an inductor including a conductive path formed in an integrated circuit device, the conductive path including multiple turns;
a first segment, a second segment, and a third segment of the conductive path formed in a first level of the integrated circuit device;
a fourth segment of the conductive path formed in a second level of the integrated circuit device, the fourth segment electrically coupling the first segment to the second segment; and
a fifth segment of the conductive path formed in a level of the integrated circuit device different from the first level, the fifth segment electrically coupling the second segment to the third segment;
a first terminal in electrical contact with a first location of the conductive path;
a first additional terminal in electrical contact with a first additional location of the conductive path;
a second terminal in electrical contact with a second location of the conductive path; and
a second additional terminal in electrical contact with a second additional location of the conductive path;
a first capacitor, and a first switch coupled between the first capacitor and the first terminal; and
a second capacitor, and a second switch coupled between the second capacitor and the second terminal.

8. An apparatus comprising:
an inductor including a conductive path formed in an integrated circuit device, the conductive path including multiple turns;
a first segment, a second segment, and a third segment of the conductive path formed in a first level of the integrated circuit device;
a fourth segment of the conductive path formed in a second level of the integrated circuit device, the fourth segment electrically coupling the first segment to the second segment; and
a fifth segment of the conductive path formed in a level of the integrated circuit device different from the first level, the fifth segment electrically coupling the second segment to the third segment, wherein part of the third segment is between part of the fourth segment and a substrate of the integrated circuit device.

9. The apparatus of claim 8, further comprising:
a first via between the first and second levels;
a second via between the first and second levels;
a first conductive material in the first via, the first conductive material electrically in contact with the first and fourth segments; and
a second conductive material in the second via, the second conductive material electrically, in contact with the second and fourth segments.

10. The apparatus of claim 9, further comprising:
a third via between the first and second levels;
a fourth via between the first and second levels;
a third conductive material in the third via, the third conductive material electrically in contact with the second and fifth segments; and a fourth conductive material in the fourth via, the fourth conductive material electrically in contact with the third and fifth segments.

11. The apparatus of claim 8, wherein part of the second segment is between part of the fifth segment and the substrate.

12. The apparatus of claim 8, wherein:
the conductive path includes a sixth segment formed in the first level; and
the conductive path includes a seventh segment formed in a level of the integrated circuit device different from the first level, and the seventh segment electrically couples the third segment to the sixth segment.

13. The apparatus of claim 12, wherein:
the conductive path includes an eighth segment formed in the first level; and
the conductive path includes a ninth segment formed in a level of the integrated circuit device different from the first level, and the ninth segmen electrically couples the sixth segment to the eighth segment.

14. An apparatus comprising:
an antenna; and
a circuit path included in an integrated circuit device and coupled to the antenna, the circuit path including a mixer and oscillator circuitry coupled to the mixer, the oscillator circuitry including:
an inductor including a conductive path, the conductive path including a first segment, a second segment, and a third segment formed in a first level of the integrated circuit device, a fourth segment formed in a second level of the integrated circuit device, the fourth segment electrically coupling the first segment to the second segment, and a fifth segment formed in a level of the integrated circuit device different from the first level, the fifth segment electrically coupling the second segment to the third segment;
a first oscillator including a first terminal coupled to the conductive path of the inductor to provide a first signal, the first signal having a first frequency; and
a second oscillator including a second terminal coupled to the conductive path of the inductor to provide a second signal, the second signal having a second frequency different from the first frequency.

15. The apparatus of claim 14, wherein the circuit path is a receiving path of the integrated circuit device.

16. The apparatus of claim 14, wherein the circuit path is a transmitting path of the integrated circuit device.

17. The apparatus of claim 14, wherein the antenna is to receive a first receive signal during a first time interval, and the first frequency of the first signal generated from the first oscillator is based on a frequency of the first receive signal.

18. The apparatus of claim 17, wherein the antenna is to receive a second receive signal during a second time interval, and the second frequency of the second signal generated from the second oscillator is based on a frequency of the second receive signal.

19. The apparatus of claim 14, wherein the antenna is to transmit a first transmit signal during the first time interval, and the first frequency of the first signal generated from the first oscillator is based on a frequency of the first transmit signal.

20. The apparatus of claim 19, wherein the antenna is to transmit a second transmit signal during the second time interval, and the second frequency of the second signal generated from the second oscillator is based on a frequency of the second transmit signal.

* * * * *